(12) United States Patent
Hong et al.

(10) Patent No.: US 12,004,411 B2
(45) Date of Patent: Jun. 4, 2024

(54) VIEWING ANGLE SWITCHABLE DISPLAY DEVICE

(71) Applicant: LG Display Co., Ltd., Seoul (KR)

(72) Inventors: Soon-Hwan Hong, Paju-si (KR);
Chang-Soo Kim, Paju-si (KR);
Sang-Hak Shin, Paju-si (KR);
Cheol-Hwan Lee, Paju-si (KR);
Seong-Yeong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/995,000

(22) Filed: Nov. 28, 2022

(65) Prior Publication Data

US 2023/0217690 A1  Jul. 6, 2023

(30) Foreign Application Priority Data

Dec. 30, 2021  (KR) ......................... 10-2021-0192430

(51) Int. Cl.
*H10K 59/80* (2023.01)
*G06F 3/041* (2006.01)
*G09G 3/3233* (2016.01)
*H10K 59/40* (2023.01)

(52) U.S. Cl.
CPC ....... *H10K 59/8792* (2023.02); *G06F 3/0412* (2013.01); *G09G 3/3233* (2013.01); *H10K 59/40* (2023.02); *G09G 2300/0426* (2013.01); *G09G 2300/0842* (2013.01); *G09G 2300/0861* (2013.01); *G09G 2320/068* (2013.01)

(58) Field of Classification Search
CPC ...... G06F 3/041–047; G06F 2203/041–04114; H01K 59/00–95; H10K 59/40
See application file for complete search history.

(56) References Cited

U.S. PATENT DOCUMENTS

| 10,802,268 | B2 | 10/2020 | Lee | |
| 2015/0048333 | A1* | 2/2015 | Choi | H10K 50/858 257/40 |
| 2018/0166510 | A1* | 6/2018 | Lee | H10K 59/35 |
| 2019/0097167 | A1 | 3/2019 | Sun et al. | |

(Continued)

FOREIGN PATENT DOCUMENTS

| JP | 2011-65773 A | 3/2011 |
| KR | 10-2015-0061558 A | 6/2015 |
| KR | 10-2019-0011372 A | 2/2019 |

*Primary Examiner* — Sanjiv D. Patel
(74) *Attorney, Agent, or Firm* — Birch, Stewart, Kolasch & Birch, LLP

(57) ABSTRACT

A viewing angle switchable display device can include a display panel including first, second, and third sub-pixels, each of the first, second, and third sub-pixels having a first emission area and a second emission area spaced apart from the first emission area; and a lens layer disposed over the display panel and including a first type of lens corresponding to the first emission area and a second type of lens corresponding to the second emission area, in which the first type of lens has a different shape than the second type of lens. Also, the display panel is configured to display an image according to a wide view mode via the first emission area and the first type of lens, and display the image according to a narrow view mode via the second emission area and the second type of lens.

23 Claims, 22 Drawing Sheets

(56) References Cited

U.S. PATENT DOCUMENTS

| | | | |
|---|---|---|---|
| 2019/0206955 A1* | 7/2019 | Paek | H01L 29/78633 |
| 2020/0211473 A1 | 7/2020 | Kim et al. | |
| 2020/0365831 A1* | 11/2020 | Polyakov | H10K 50/852 |
| 2021/0191556 A1* | 6/2021 | Lee | H10K 59/352 |
| 2021/0193763 A1 | 6/2021 | Sun et al. | |
| 2021/0201798 A1* | 7/2021 | Kim | G09G 3/3233 |
| 2022/0319417 A1* | 10/2022 | Liu | G09G 3/3233 |

* cited by examiner

VIEWING ANGLE SWITCHABLE DISPLAY DEVICE

CROSS-REFERENCE TO RELATED APPLICATION

The present application claims priority to Korean Patent Application No. 10-2021-0192430 filed in the Republic of Korea on Dec. 30, 2021, which is hereby incorporated by reference in its entirety.

BACKGROUND

Field of the Disclosure

The present disclosure relates to a display device, and more particularly, to a viewing angle switchable display device.

Description of the Background

As the information society progresses, a demand for different types of display devices increases, and flat panel display devices (FPD) such as liquid crystal display devices (LCD) and organic light-emitting diode display devices (OLED) have been developed and applied to various fields.

Among the flat panel display devices, organic light-emitting diode display devices, which are also referred to as organic electroluminescent display devices, emit light due to the radiative recombination of an exciton after forming the exciton from an electron and a hole by injecting charges into a light-emitting layer between a cathode for injecting electrons and an anode for injecting holes in a light-emitting diode.

The organic light-emitting diode display device can be formed on a flexible substrate, such as plastic. In addition, because it is self-luminous, the organic light-emitting diode display device has an excellent contrast ratio and an ultra-thin thickness, and has a response time of several micro seconds, and thus there are advantages in displaying moving images and video without delays. The organic light-emitting diode display device also has a wide viewing angle and is stable under low temperatures. Since the organic light-emitting diode display device is driven by low voltage of direct current (DC) 5V to 15V, it is easy to design and manufacture driving circuits.

As mentioned above, although there is no limit to the viewing angle of the organic light-emitting diode display device, it has recently been desirable to limit the viewing angle for reasons of privacy protection and information protection.
In addition, when the organic light-emitting diode display device is used as a display for providing driving information for a vehicle, an image displayed by the organic light-emitting diode display device is reflected on the windshield of the vehicle and obstructs the driver's view. The reflection of the image in the vehicle is particularly severe when driving at night, which interferes with safe driving. Accordingly, it is desirable to limit the viewing angle of the organic light-emitting diode display device applied to the vehicle so that the displayed image does not unduly obstruct the driver's view or distract the driver.

Also, it is desirable to dynamically or selectively vary the viewing angle on demand depending on whether the driver is driving or not and whether the driver and the front-seat passenger are watching the display device or not.

SUMMARY OF THE DISCLOSURE

Accordingly, the present disclosure is directed to a viewing angle switchable display device that substantially obviates one or more of the problems due to limitations and disadvantages described above.

More specifically, the present disclosure is to provide a viewing angle switchable display device capable of selectively limiting the viewing angle on demand.

Additional features and aspects will be set forth in the description that follows, and in part will be apparent from the description, or may be learned by practice of the present disclosure provided herein. Other features and aspects of the inventive concepts may be realized and attained by the structure particularly pointed out in the written description, or derivable therefrom, and the claims hereof as well as the appended drawings.

To achieve these and other aspects of the present disclosure, as embodied and broadly described herein, a viewing angle switchable display device includes a display panel including first, second, and third sub-pixels, each of the first, second, and third sub-pixels having a first emission area and a second emission area; a lens layer over the display panel and including a first lens corresponding to the first emission area and a second lens corresponding to the second emission area, in which the first and third sub-pixels are disposed adjacent to each other in a first direction, and the second sub-pixel is disposed adjacent to the first and third sub-pixels in a second direction perpendicular to the first direction.

In another aspect, a viewing angle switchable display device includes a display panel including first, second, and third sub-pixels, each of the first, second, and third sub-pixels having a first emission area and a second emission area; a lens layer over the display panel and including a first lens corresponding to the first emission area and a second lens corresponding to the second emission area, wherein the first and third sub-pixels are disposed adjacent to each other in a first direction, and the second sub-pixel is disposed adjacent to the first and third sub-pixels in a second direction perpendicular to the first direction.

It is to be understood that both the foregoing general description and the following detailed description are examples and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION OF THE EMBODIMENTS

Reference will now be made in detail to aspects of the disclosure, example embodiments of which are illustrated in the accompanying drawings.

Figure 1:
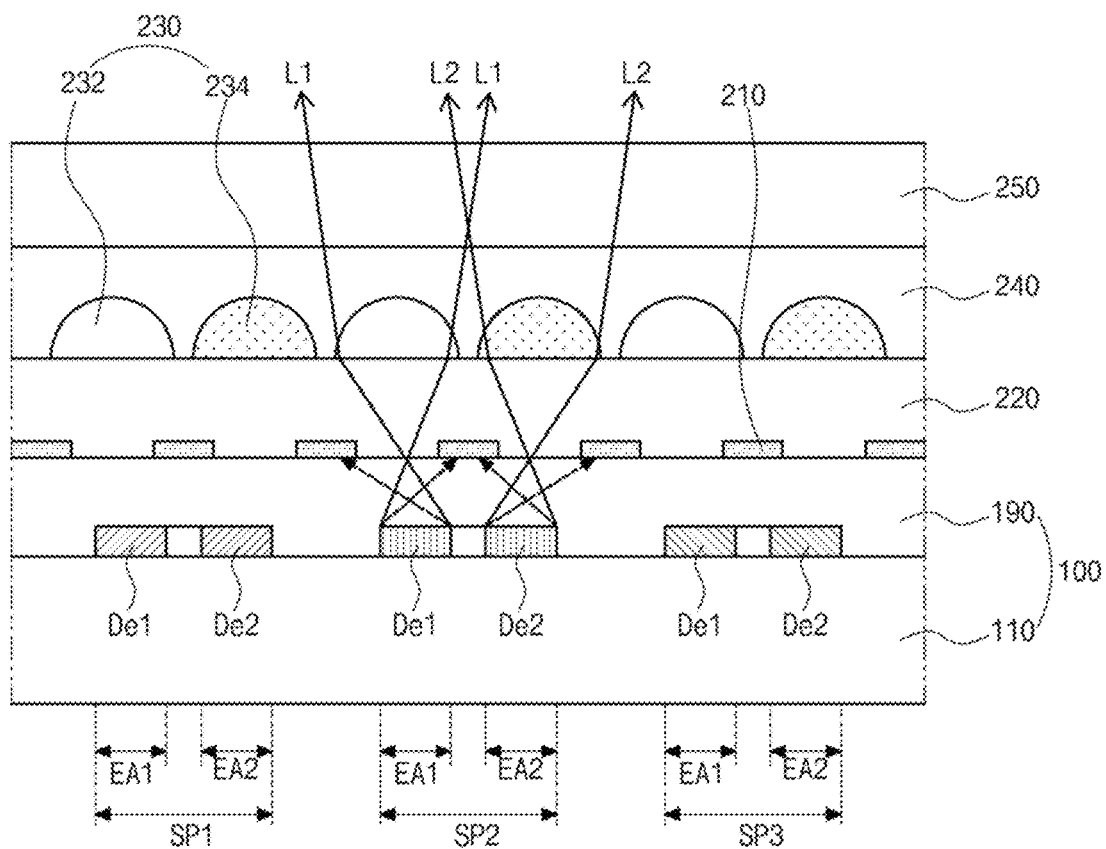
FIG. 1 is a schematic cross-sectional view of a viewing angle switchable display device according to an embodiment of the present disclosure.

FIG. 1 is a schematic cross-sectional view of a viewing angle switchable display device according to an embodiment of the present disclosure.

In FIG. 1, the viewing angle switchable display device according to the embodiment of the present disclosure can include a display panel 100, light-blocking patterns 210, an optical gap layer 220, a lens layer 230, a planarization layer 240, and a polarization layer 250.

The display panel 100 can include a substrate 110, first and second light-emitting diodes De1 and De2, and an encapsulation layer 190.

Here, first, second, and third sub-pixels SP1, SP2, and SP3 can be defined on the substrate 110. Each of the first, second, and third sub-pixels SP1, SP2, and SP3 can have a first emission area EA1 and a second emission area EA2.

The first light-emitting diode De1 can be provided in the first emission area EA1, and the second light-emitting diode De2 can be provided in the second emission area EA2.

The first, second, and third sub-pixels SP1, SP2, and SP3 can be red, green, and blue sub-pixels, respectively. Accordingly, the first and second light-emitting diodes De1 and De2 of the first sub-pixel SP1 can emit red light, the first and second light-emitting diodes De1 and De2 of the second sub-pixel SP2 can emit green light, and the first and second light-emitting diodes De1 and De2 of the third sub-pixel SP3 can emit blue light.

Next, the encapsulation layer 190 can be provided on the first and second light-emitting diodes De1 and De2 to cover and/or protect the first and second light-emitting diodes De1 and De2 from moisture and/or oxygen. The encapsulation layer 190 can have a flat top surface.

The specific configuration of the display panel 100 will be described in detail later.

The light-blocking patterns 210 can be provided on the display panel 100, more specifically, on the encapsulation layer 190. The light-blocking patterns 210 can be formed to correspond to a portion between adjacent ones of the first, second, and third sub-pixels SP1, SP2, and SP3 and a portion between the first and second emission areas EA1 and EA2 of each of the sub-pixels.

The light-blocking patterns 210 can be a black matrix and can be formed of a black resin or chromium oxide. Alternatively, the light-blocking patterns 210 can be touch electrodes and can be formed of a metal. In this situation, the touch electrodes can include a plurality of transmitter electrodes and a plurality of receiver electrodes crossing each other, and a touch can be detected from the amount of change in capacitance between the plurality of transmitter electrodes and the plurality of receiver electrodes.

The optical gap layer 220 can be provided on the light-blocking patterns 210. The optical gap layer 220 can secure an optical gap or distance between the first and second light-emitting diodes De1 and De2 and lenses 232 and 234 of the lens layer 230, so that light from the first and second light-emitting diodes De1 and De2 can be refracted in a predetermined direction by the lenses 232 and 234, thereby improving the efficiency of the lenses 232 and 234. The optical gap layer 220 can have a thickness of several to several tens of μm and can be formed of an organic insulating material.

For example, the optical gap layer 220 can be formed of photo acryl, benzocyclobutene (BCB), polyimide (PI), or polyamide (PA), but embodiments are not limited thereto. The optical gap layer 220 can be thicker than the light blocking patterns 210.

The lens layer 230 can be provided on the optical gap layer 220. The lens layer 230 can include a first lens 232 and a second lens 234. The first lens 232 can correspond to the first emission area EA1, that is, the first light-emitting diode De1, and the first lens 232 and the first light-emitting diode De1 can overlap each other in a vertical direction perpendicular to the substrate 110. The second lens 234 can correspond to the second emission area EA2, that is, the second light-emitting diode De2, and the second lens 234 and the second light-emitting diode De2 can overlap each other in the vertical direction perpendicular to the substrate 110. The first and second lenses 232 and 234 can at least partly overlap the light-blocking patterns 210 being disposed between the lens layer 230 and the encapsulation layer 190. Furthermore, the first and second lenses 232 and 234 can respectively overlap the first and second light-emitting diodes De1 and De2.

The first lens 232 can be a hemispherical lens (e.g., a dome shaped lens), and the second lens 234 can be a semi-cylindrical lens.

Accordingly, a first light L1 emitted from the first light-emitting diode De1 of each sub-pixel SP1, SP2, and SP3 can be output at a specific angle by the first lens 232, and a second light L2 emitted from the second light-emitting diode De2 of each sub-pixel SP1, SP2, and SP3 can be output at a specific angle by the second lens 234, thereby limiting a viewing angle.

The planarization layer 240 can be provided on the lens layer 230 to protect the first and second lenses 232 and 234. The planarization layer 240 can be formed of an organic insulating material and can have a flat top surface. The planarization layer 240 can be provided between the first and second lenses 232 and 234 in a horizontal direction parallel to the substrate 110. A refractive index of the planarization layer 240 can be smaller than refractive indexes of the first and second lenses 232 and 234.

For example, the planarization layer 240 can be formed of photo acryl, benzocyclobutene (BCB), polyimide (PI), or polyamide (PA), but embodiments are not limited thereto.

The polarization layer 250 can be provided on the planarization layer 240. The polarization layer 250 can include a linear polarization layer and a retardation layer and can serve to prevent external light reflected by the display panel 100 from being output to the outside again by changing the polarization state of the external light incident on the display panel 100.

The display panel of the viewing angle switchable display device according to the embodiment of the present disclosure will be described with reference to FIG. 2.

Figure 2:
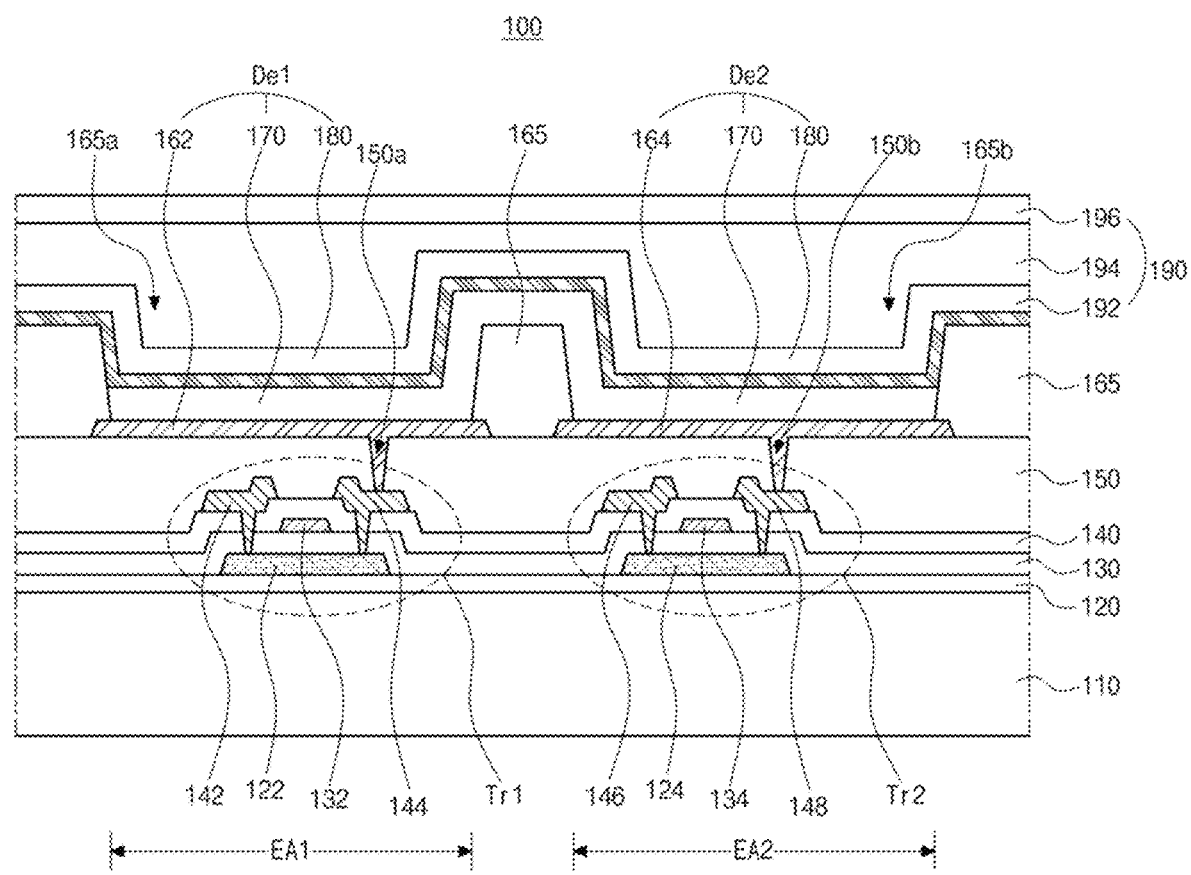
FIG. 2 is a schematic cross-sectional view of the display panel of the viewing angle switchable display device according to the embodiment of the present disclosure.

FIG. 2 is a schematic cross-sectional view of the display panel of the viewing angle switchable display device according to the embodiment of the present disclosure and shows one sub-pixel.

In FIG. 2, the display panel 100 of the viewing angle switchable display device according to the embodiment of the present disclosure can include the substrate 110, first and second thin film transistors Tr1 and Tr2, the first and second light-emitting diodes De1 and De2, and the encapsulation layer 190.

Specifically, each sub-pixel can include the first emission area EA1 and the second emission area EA2 on the substrate 110. The substrate 110 can be a glass substrate or a plastic substrate. For example, polyimide (PI) can be used for the plastic substrate, but embodiments are not limited thereto.

A buffer layer 120 can be formed on the substrate 110. The buffer layer 120 can be disposed over substantially an entire surface of the substrate 110. The buffer layer 120 can be formed of an inorganic material, such as silicon oxide ($SiO_2$) or silicon nitride (SiNx), and can have a single-layer structure or a multiple-layer structure.

First and second semiconductor layers 122 and 124 can be patterned and formed on the buffer layer 120 in the first and second emission areas EA1 and EA2, respectively.

The first and second semiconductor layers 122 and 124 can be formed of an oxide semiconductor material. In this situation, shield patterns can be further formed under the first and second semiconductor layers 122 and 124. The shield patterns can block light incident on the first and second semiconductor layers 122 and 124, thereby preventing the first and second semiconductor layers 122 and 124 from being degraded due to the light.

Alternatively, the first and second semiconductor layers 122 and 124 can be formed of polycrystalline silicon. In this situation, both ends of the first and second semiconductor layers 122 and 124 can be doped with impurities.

A gate insulation layer 130 of an insulating material can be formed on the first and second semiconductor layers 122 and 124 over substantially the entire surface of the substrate 110. The gate insulation layer 130 can be formed of an inorganic insulating material such as silicon oxide ($SiO_2$) or silicon nitride (SiNx).

Here, when the first and second semiconductor layers 122 and 124 are formed of an oxide semiconductor material, the gate insulation layer 130 can be formed of silicon oxide ($SiO_2$). Alternatively, when the first and second semiconductor layers 122 and 124 are formed of polycrystalline silicon, the gate insulation layer 130 can be formed of silicon oxide ($SiO_2$) or silicon nitride (SiNx).

Next, first and second gate electrodes 132 and 134 of a conductive material such as metal can be formed on the gate insulation layer 130 to correspond to the first and second semiconductor layers 122 and 124, respectively. In addition, a gate line can be formed on the gate insulation layer 130, and the gate line can extend in one direction.

Meanwhile, in the embodiment of the present disclosure, the gate insulation layer 130 can be formed over substantially the entire surface of the substrate 110. However, the gate insulation layer 130 can be patterned to have the same shape as the first and second gate electrodes 132 and 134.

An interlayer insulation layer 140 of an insulating material can be formed on the first and second gate electrodes 132 and 134 over substantially the entire surface of the substrate 110. The interlayer insulation layer 140 can be formed of an inorganic insulating material, such as silicon oxide ($SiO_2$) or silicon nitride (SiNx), or can be formed of an organic insulating material, such as photo acryl or benzocyclobutene.

The interlayer insulation layer 140 can have contact holes exposing top surfaces of both ends of each of the first and second semiconductor layers 122 and 124. The contact holes can also be formed in the gate insulation layer 130.

Next, first source and first drain electrodes 142 and 144 and second source and second drain electrodes 146 and 148 of a conductive material such as metal can be formed on the interlayer insulation layer 140 in the first and second emission areas EA1 and EA2. In addition, a data line and a power line, which can extend in a direction perpendicular to the one direction, can be formed on the interlayer insulation layer 140.

The first source and first drain electrodes 142 and 144 can be in contact with the both ends of the first semiconductor layer 122 through the contact holes, and the second source and second drain electrodes 146 and 148 can be in contact with the both ends of the second semiconductor layer 124 through the contact holes, respectively. Also, the data line can cross the gate line to define a pixel region corresponding to each sub-pixel, and the power line can be spaced apart from and parallel to the data line.

Meanwhile, the first semiconductor layer 122, the first gate electrode 132, the first source electrode 142, and the first drain electrode 144 can constitute the first thin film transistor Tr1, and the second semiconductor layer 124, the second gate electrode 134, the second source electrode 146, and the second drain electrode 148 can constitute the second thin film transistor Tr2.

One or more thin film transistors having the same structure as the first and second thin film transistors Tr1 and Tr2 can be further formed in each sub-pixel on the substrate 110, but embodiments are not limited thereto.

A protection layer 150 of an insulating material can be formed on the first source and first drain electrodes 142 and 144 and the second source and second drain electrodes 146 and 148 over substantially the entire surface of the substrate 110. The protection layer 150 can be formed of an organic insulating material, such as photo acryl or benzocyclobutene. The protection layer 150 can have a flat top surface. The protection layer 150 can planarize the layered structure of the first and second transistors Tr1 and Tr2.

Meanwhile, an insulation layer of an inorganic insulating material, such as silicon oxide ($SiO_2$) or silicon nitride (SiNx), can be further formed under the protection layer 150, that is, between the first and second thin film transistors Tr1 and Tr2 and the protection layer 150.

The protection layer 150 can have first and second drain contact holes 150a and 150b exposing the first and second drain electrodes 144 and 148, respectively.

Next, first and second anode electrodes 162 and 164 of a conductive material having a relatively high work function can be formed on the protection layer 150. The first anode electrode 162 can be disposed in the first emission area EA1 and can be in contact with the first drain electrode 144 through the first drain contact hole 150a. The second anode electrode 164 can be disposed in the second emission area EA2 and can be in contact with the second drain electrode 148 through the second drain contact hole 150b.

For example, the first and second anode electrodes 162 and 164 can be formed of a transparent conductive material, such as indium tin oxide (ITO) or indium zinc oxide (IZO), but embodiments are not limited thereto.

Meanwhile, the display panel 100 according to the embodiment of the present disclosure can be a top-emission type, in which light from the first and second light-emitting diodes De1 and De2 is output toward a direction opposite the substrate 110. Accordingly, the first and second anode electrodes 162 and 164 can further include a reflection electrode or a reflection layer of a metal material having relatively high reflectance below the transparent conductive material. For example, the reflection electrode or reflection layer can be formed of an aluminum-palladium-copper (APC) alloy, silver (Ag) or aluminum (Al). In this situation, the first and second anode electrodes 162 and 164 can have a triple-layer structure of ITO/APC/ITO, ITO/Ag/ITO or ITO/Al/ITO, but embodiments are not limited thereto.

A bank 165 of an insulating material can be formed on the first and second anode electrodes 162 and 164, i.e. edges or circumferences of the first and second anode electrodes 162 and 164. The bank 165 can overlap and cover edges of the first and second anode electrodes 162 and 164. The bank 165 can have first and second openings 165a and 165b exposing the first and second anode electrodes 162 and 164, respectively.

At least a top surface of the bank 165 can be hydrophobic, and a side surface of the bank 165 can be hydrophobic or hydrophilic. The bank 165 can be formed of an organic insulating material having a hydrophobic property. Alternatively, the bank 165 can be formed of an organic insulating material having a hydrophilic property and can be subjected to a hydrophobic treatment.

In the present disclosure, the bank 165 can have a single-layer structure. However, the bank 165 can have a double-layer structure. That is, the bank 165 can include a hydrophilic bank of a lower side and a hydrophobic bank of an upper side. The bank 165 can electrically separate the first and second anode electrodes 162 and 164 to thereby control the first and second light-emitting diodes De1 and De2 independently.

Next, a light-emitting layer 170 can be formed on the first and second anode electrodes 162 and 164 exposed through the first and second openings 165a and 165b of the bank 165. A portion of the light-emitting layer 170 on the first anode electrode 162 and a portion of the light-emitting layer 170 on the second anode electrode 164 can be connected to each other and can be formed as one body. However, the present disclosure is not limited thereto. Alternatively, the portion of the light-emitting layer 170 on the first anode electrode 162 and the portion of the light-emitting layer 170 on the second anode electrode 164 can be separated from each other.

Also, the light-emitting layer 170 can include a first charge auxiliary layer, a light-emitting material layer, and a second charge auxiliary layer sequentially stacked from a top surface of the first and second anode electrodes 162 and 164. The light-emitting material layer can be formed of any one of red, green, and blue luminescent materials, but embodiments are not limited thereto. The luminescent material can be an organic luminescent material, such as a phosphorescent compound or a fluorescent compound, or can be an inorganic luminescent material, such as a quantum dot.

The first charge auxiliary layer can be a hole auxiliary layer, and the hole auxiliary layer can include at least one of a hole injection layer (HIL) and a hole transport layer (HTL). In addition, the second charge auxiliary layer can be an electron auxiliary layer, and the electron auxiliary layer can include at least one of an electron injection layer (EIL) and an electron transport layer (ETL).

The light-emitting layer 170 can be formed through an evaporation process. In this situation, in order to pattern the light-emitting layer 170 for each sub-pixel, a fine metal mask (FMM) can be used. Alternatively, the light-emitting layer 170 can be formed through a solution process. In this situation, the light-emitting layer 170 can be provided only in the first and second openings 165a and 165b, and a height of the light-emitting layer 170 in a region adjacent to the bank 165 can rise as the light-emitting layer 170 gets closer to the bank 165 (e.g., forming a concave structure).

A cathode electrode 180 of a conductive material, having relatively low work function, can be formed on the light-emitting layer 170 over substantially the entire surface of the substrate 110. The cathode electrode 180 can be formed of aluminum, magnesium, silver, or an alloy thereof. At this time, the cathode electrode 180 can have a relatively thin thickness such that light from the light-emitting layer 170 can be transmitted therethrough.

Alternatively, the cathode electrode 180 can be formed of a transparent conductive material, such as indium gallium oxide (IGO), but embodiments are not limited thereto.

The first anode electrode 162, the light-emitting layer 170, and the cathode electrode 180 of the first emission area EA1 can constitute the first light-emitting diode De1, and the second anode electrode 164, the light-emitting layer 170, and the cathode electrode 180 of the second emission area EA2 can constitute the second light-emitting diode De2.

As described above, the display panel 100 according to the embodiment of the present disclosure can be a top-emission type, in which light from the first and second light-emitting diodes De1 and De2 is output toward a direction opposite the substrate 110, that is, is output through the cathode electrode 180. The top-emission type display panel can have a wider emission region than a bottom-emission type display panel of the same size, which can improve luminance and reduce power consumption.

The encapsulation layer 190 can be formed on the cathode electrode 180 over substantially the entire surface of the substrate 110. The encapsulation layer 190 can prevent moisture or oxygen from being introduced into the first and second light-emitting diodes De1 and De2 from the outside.

The encapsulation layer 190 can have a stacked structure of a first inorganic layer 192, an organic layer 194, and a second inorganic layer 196. Here, the organic layer 194 can be a layer that covers particles generated during a manufacturing process.

As described above, in the viewing angle switchable display device according to the embodiment of the present disclosure, each sub-pixel SP1, SP2, and SP3 can have the first and second emission areas EA1 and EA2, the first lens 232 of a hemispherical shape can be provided in the first emission area EA1, and the second lens 234 of a semi-cylindrical shape can be provided in the second emission area EA2, thereby limiting the viewing angle. In this way, two different types of displays can be provided in one display package (e.g. a wide angle display viewing mode and a narrow angle display viewing mode).

A pixel structure of the viewing angle switchable display device according to the embodiment of the present disclosure will be described with reference to FIG. 3.

Figure 3:
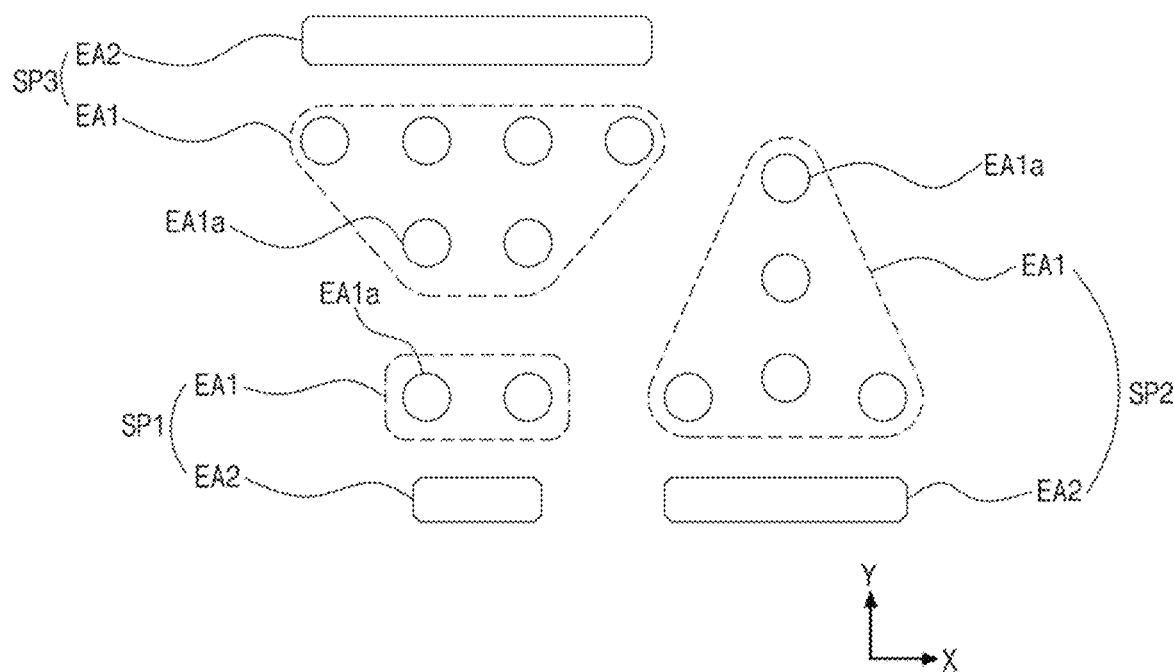
FIG. 3 is a plan view schematically illustrating a pixel of the viewing angle switchable display device according to the embodiment of the present disclosure.

FIG. 3 is a plan view schematically illustrating a pixel of the viewing angle switchable display device according to the embodiment of the present disclosure, and will be described with reference to FIG. 1 together.

In FIG. 3, the pixel of the viewing angle switchable display device according to the embodiment of the present disclosure can include the first, second, and third sub-pixels SP1, SP2, and SP3, and the first, second, and third sub-pixels SP1, SP2, and SP3 can be red, green, and blue sub-pixels, respectively.

Each of the first, second, and third sub-pixels SP1, SP2, and SP3 can have the first emission area EA1 and the second emission area EA2. The first emission area EA1 of the first, second, and third sub-pixels SP1, SP2, and SP3 can include at least one sub-emission area EA1a, and one sub-emission area EA1a can correspond to a first lens 232.

Here, the first and third sub-pixels SP1 and SP3 can be disposed along a Y direction, and the second sub-pixel SP2 can be disposed along an X direction with respect to the first and third sub-pixels SP1 and SP3. At this time, the first emission areas EA1 of the first and third sub-pixels SP1 and SP3 can be disposed between the second emission area EA2 of the first sub-pixel SP1 and the second emission area EA2 of the third sub-pixel SP3. In addition, the first emission area EA1 of the second sub-pixel SP2 can be disposed adjacent to the first emission area EA1 of the first sub-pixel SP1 and the first emission area EA1 of the third sub-pixel SP3 in the X direction, and the second emission area EA2 of the second sub-pixel SP2 can be disposed adjacent to the second emission area EA2 of the first sub-pixel SP1 in the X direction. For example, the three different colored sub-pixels can be arranged in pairs, and the pairs can be arranged in a triangle type of arrangement, but embodiments are not limited thereto.

Each of the first, second, and third sub-pixels SP1, SP2, and SP3 can have a polygonal shape (e.g. rectangle, triangle, trapezoid). In this situation, the shapes of the first, second, and third sub-pixels SP1, SP2, and SP3 can be different from each other. However, the present disclosure is not limited thereto, and the first, second, and third sub-pixels SP1, SP2, and SP3 can have various shapes.

The first, second, and third sub-pixels SP1, SP2, and SP3 can have different sizes. The sizes of the first, second, and third sub-pixels SP1, SP2, and SP3 can be determined by considering the lifetime and luminous efficiency of a light-emitting diode provided at each sub-pixel. At this time, the shorter the wavelength of light, the higher the energy of light, and thus, the lifetime of a blue light-emitting diode is the shortest and the lifetime of the red light-emitting diode is the longest. Accordingly, in order to make the lifetimes uniform, the size of the second sub-pixel SP2 can be larger than the size of the first sub-pixel SP1 and smaller than the size of the third sub-pixel SP3.

For example, the area ratio of the first, second, and third sub-pixels SP1, SP2, and SP3 can be 1:2.5:3. In addition, the area ratio of the first emission areas EA1 of the first, second, and third sub-pixels SP1, SP2, and SP3 can also be 1:2.5:3, and the area ratio of the second emission areas EA2 of the first, second, and third sub-pixels SP1, SP2, and SP3 can also be 1:2.5:3. Accordingly, the number of sub-emission areas EA1a of the first emission area EA1 of the second sub-pixel SP2 can be more than the number of sub-emission areas EA1a of the first emission area EA1 of the first sub-pixel SP1 and less than the number of sub-emission areas EA1a of the first emission area EA1 of the third sub-pixel SP3. Specifically, the first emission area EA1 of the first sub-pixel SP1 can have two sub-emission areas EA1a, the first emission area EA1 of the second sub-pixel SP2 can have five sub-emission areas EA1a, and the first emission area EA1 of the third sub-pixel SP3 can have six sub-emission areas EA1a.

At this time, two sub-emission areas EA1a of the first sub-pixel SP1 and three sub-emission areas EA1a of the second sub-pixel SP2 can be disposed substantially side by side in the X direction. Four sub-emission areas EA1a of the third sub-pixel SP3 and one sub-emission area EA1a of the second sub-pixel SP2 can be disposed substantially side by side in the X direction. Two sub-emission areas EA1a of the third sub-pixel SP3 and one sub-emission area EA1a of the second sub-pixel SP2 can be disposed substantially side by side in the X direction.

However, the embodiments are not limited thereto, and the area ratio of the first, second, and third sub-pixels SP1, SP2, and SP3 and the number of the sub-emission areas EA1a can vary.

An electrode configuration of the viewing angle switchable display device according to the embodiment of the present disclosure having the pixel structure will be described with reference to FIG. 4.

Figure 4:
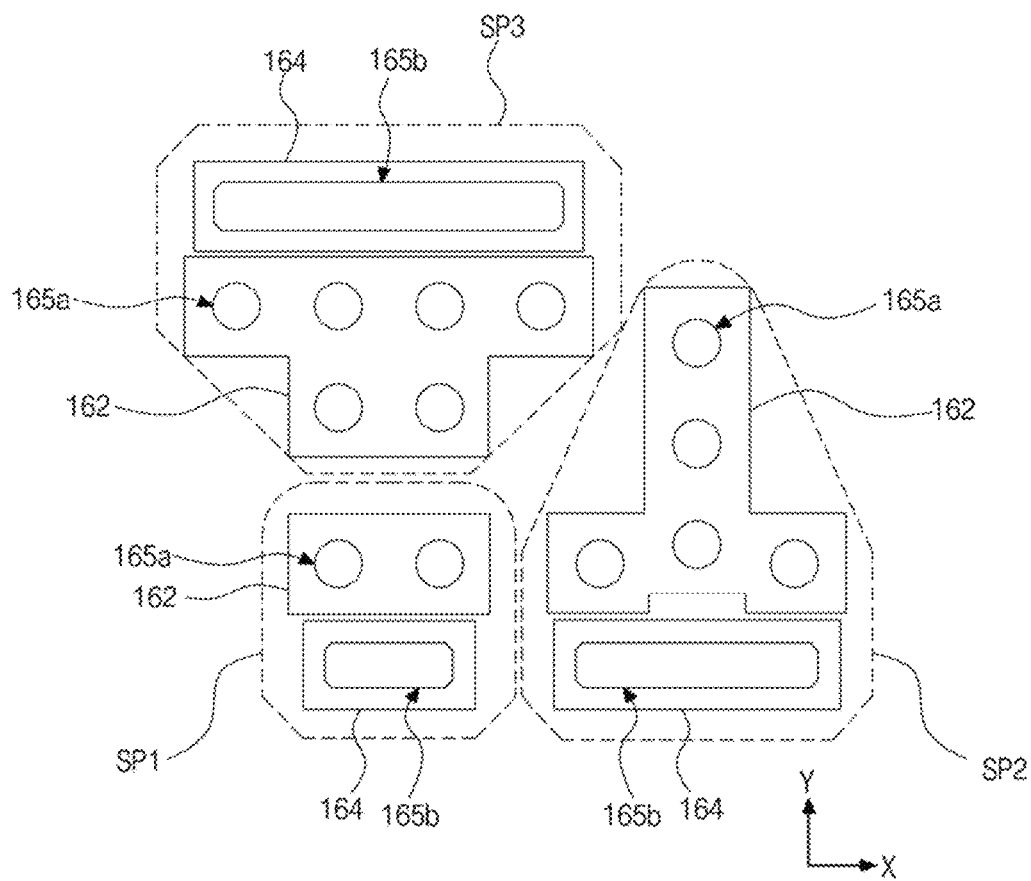
FIG. 4 is a view schematically illustrating anode electrodes for a pixel of the viewing angle switchable display device according to the embodiment of the present disclosure.

FIG. 4 is a view schematically illustrating anode electrodes for a pixel of the viewing angle switchable display device according to the embodiment of the present disclosure. FIG. 4 also shows the openings of the bank corresponding to substantial emission areas, and will be described with reference to FIG. 3 together.

In FIG. 4, each of the first, second, and third sub-pixels SP1, SP2, and SP3 can include the first anode electrode 162 provided in the first emission area EA1 and the second anode electrode 164 provided in the second emission area EA2.

A plurality of first openings 165a corresponding to the sub-emission areas EA1a of the first emission area EA1 can be provided on the first anode electrode 162, and a second openings 165b corresponding to the second emission area EA2 can be provided on the second anode electrode 164. Each of the first openings 165a can have substantially a circular shape, and the second opening 165b can have a polygonal shape in which the length in the X direction is longer than the length in the Y direction. The first anode electrodes 162 of the first, second, and third sub-pixels SP1, SP2, and SP3 can centrally located around a center of the pixel unit, while the second anode electrodes 164 of the first, second, and third sub-pixels SP1, SP2, and SP3 can be located outside of or around the first anode electrodes 162.

The first lens 232 of FIG. 1 having a hemispherical shape can be disposed to correspond to each of the first openings 165a, which can be centrally located within the pixel unit, and the second lens 234 of FIG. 1 having a semi-cylindrical shape can be disposed to correspond to the second opening 165b, which can be located along the outer edges of the pixel unit.

A lens arrangement of the viewing angle switchable display device according to the embodiment of the present disclosure having the electrode configuration will be described with reference to FIG. 5.

Figure 5:
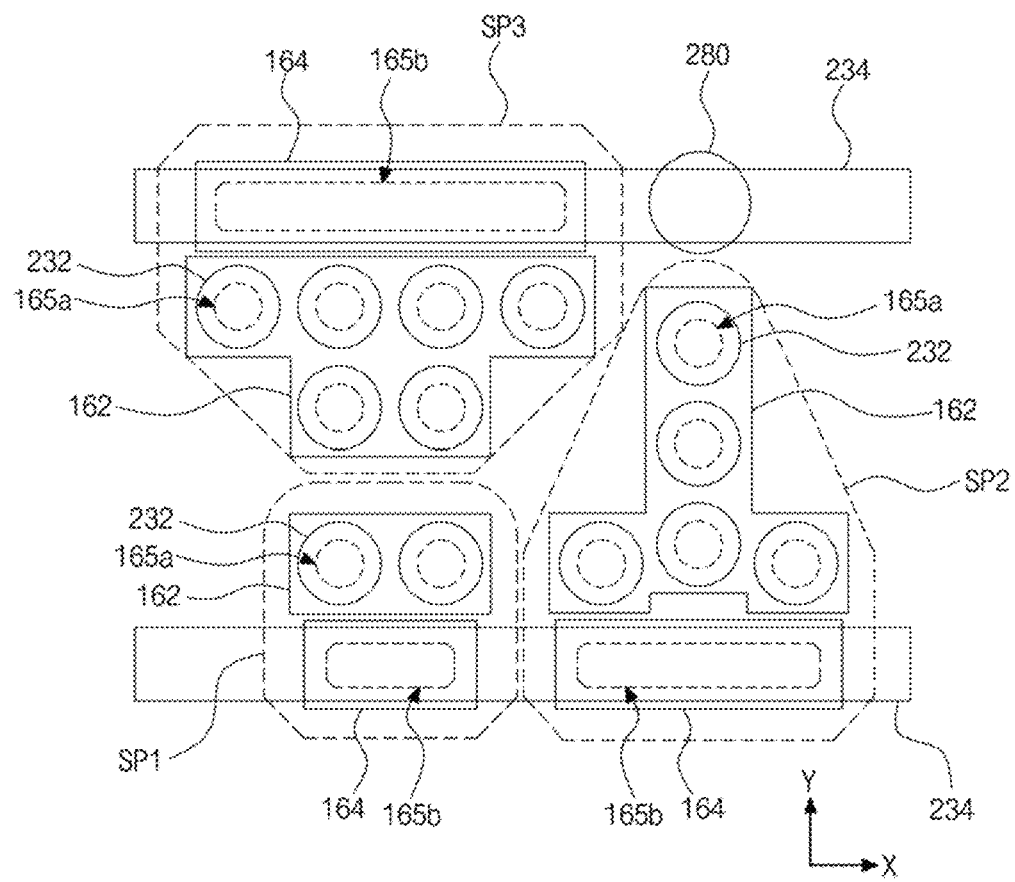
FIG. 5 is a view schematically illustrating the lens arrangement for a pixel of the viewing angle switchable display device according to the embodiment of the present disclosure.

FIG. 5 is a view schematically illustrating the lens arrangement for a pixel of the viewing angle switchable display device according to the embodiment of the present disclosure. FIG. 5 also shows the anode electrodes and the openings of the bank, and will be described with reference to FIG. 2 and FIG. 3 together.

As shown in FIG. 5, in each sub-pixel SP1, SP2, and SP3, the first lens 232 of a hemispherical shape can be disposed to correspond to the first anode electrode 162 of the first light-emitting diode De1, and the second lens 234 of a semi-cylindrical shape can be disposed to correspond to the second anode electrode 164 of the second light-emitting diode De2.

Accordingly, the first lens 232 can be disposed to correspond to the first opening 165a, and the second lens 234 can be disposed to correspond to the second opening 165b.

At this time, the first lens 232 can be disposed to correspond to each of the first openings 165, and a plurality of first lenses 232 can be provided on the first anode electrode 162 of the first light-emitting diode De1. The first lens 232 can have a larger area than the corresponding first opening 165a.

Therefore, the plurality of first lenses 232 can correspond to the first emission area EA1 of each sub-pixel SP1, SP2, and SP3.

On the other hand, the second lens 234 can extend in the X direction, and one second lens 234 can be disposed to correspond to the second openings 165b of adjacent sub-pixels SP1, SP2, and SP3. The second lens 234 can have a larger area than the corresponding second opening 165b.

Here, one second lens 234 can be disposed to correspond to the second anode electrodes 164 of the second light-emitting diodes De2 of the first and second sub-pixels SP1 and SP2. Another second lens 234 can be disposed to correspond to the second anode electrode 164 of the third sub-pixel SP3, and the another second lens 234 can also correspond to a second anode electrode 164 of another third sub-pixel SP3 adjacent thereto in the X direction.

Accordingly, a second lens 234 can correspond to a plurality of second emission areas EA2 of the adjacent sub-pixels SP1, SP2, and SP3 in the X direction. Specifically, one second lens 234 can correspond to the second emission areas EA2 of adjacent first and second sub-pixels SP1 and SP2 in the X direction, and another second lens 234 can correspond to the second emission areas EA2 of adjacent third sub-pixels SP3 in the X direction. For example, since the second anode electrodes 164 of the first, second, and third sub-pixels SP1, SP2, and SP3 can be located outside the first anode electrodes 162 or at the out edges of the pixel unit, one long second lens 234 of the semi-cylindrical shape can extend across the second emission areas EA2 of a plurality of sub-pixels, providing for a more compact and efficient layout.

Meanwhile, a spacer 280 can be provided adjacent to the second anode electrode 164 of the third sub-pixel SP3 in the X direction and adjacent to the first anode electrode 162 of the second sub-pixel SP2, and the another second lens 234 can be disposed to correspond to the spacer 280.

The spacer 280 can serve to support the fine metal mask when the light-emitting layer 180 of FIG. 2 is formed through the evaporation process. Alternatively, when the light-emitting layer 180 of FIG. 2 is formed through the solution process, the spacer 280 can be omitted.

As described above, in the viewing angle switchable display device according to the embodiment of the present disclosure, the viewing angle can be limited by providing the first lens 232 of a hemispherical shape corresponding to the first anode electrode 162 and the second lens 234 of a semi-cylindrical shape corresponding to the second anode electrode 164. At this time, the first lens 232 and the second lens 234 can have different viewing angle limiting directions, and a wide viewing angle and a narrow viewing angle can be implemented through selective driving. In this way, two different types of display devices can efficiently implemented in one package (e.g., a wide viewing angle mode, and a narrow viewing angle mode).

The implementation of the wide viewing angle and the narrow viewing angle will be described in detail with reference to FIGS. 6A to 9.

Figure 6A:
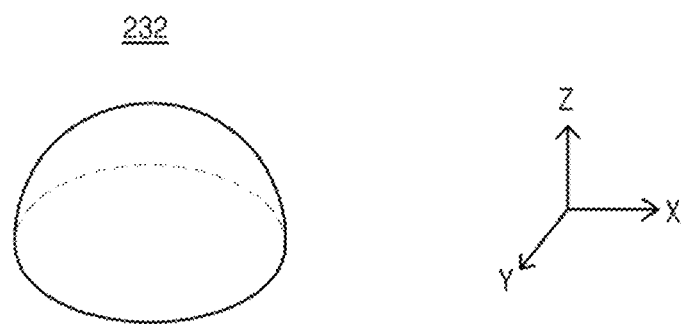
FIG. 6A is a view schematically illustrating the first lens according to the embodiment of the present disclosure.
Figure 6B:
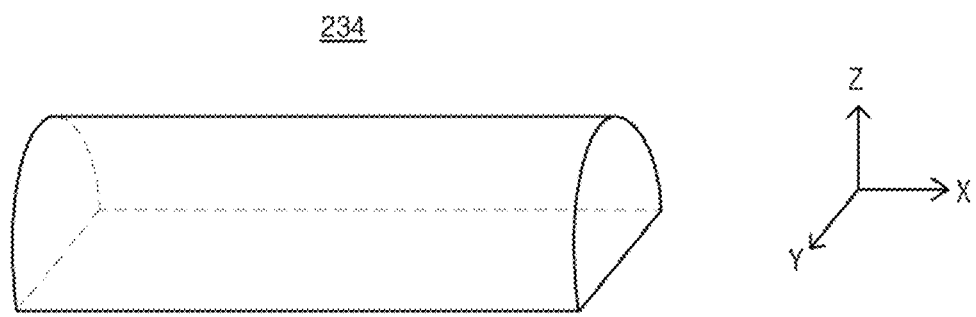
FIG. 6B is a view schematically illustrating the second lens according to the embodiment of the present disclosure.

FIG. 6A is a view schematically illustrating the first lens according to the embodiment of the present disclosure, and FIG. 6B is a view schematically illustrating the second lens according to the embodiment of the present disclosure.

In FIG. 6A, the first lens 232 can be a hemispherical lens and can have semicircular cross-sections in the X direction and the Y direction. Accordingly, the first lens 232 can limit the viewing angles in the X direction and the Y direction.

On the other hand, in FIG. 6B, the second lens 234 can be a semi-cylindrical lens and can have a rectangular cross-section in the X direction and a semicircular cross-section in the Y direction. Accordingly, the second lens 234 can limit the viewing angle in the Y direction and cannot limit the viewing angle in a length direction of the second lens 234, that is, the X direction.

The viewing angle characteristics by the first lens 232 and the second lens 234 will be described with reference to FIG. 7A and FIG. 7B.

Figure 7A:
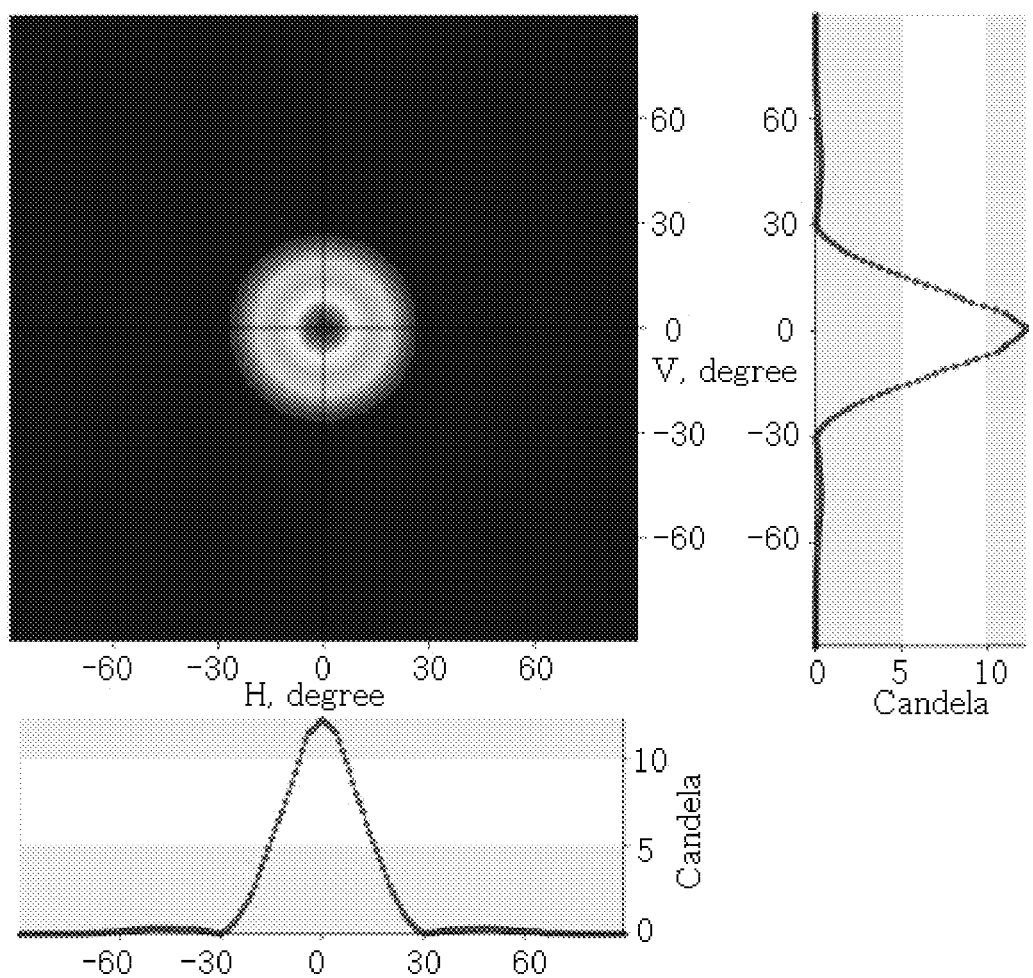
FIG. 7A is a view showing the optical profile with respect to the viewing angle of the first lens of the viewing angle switchable display device according to the embodiment of the present disclosure.
Figure 7B:
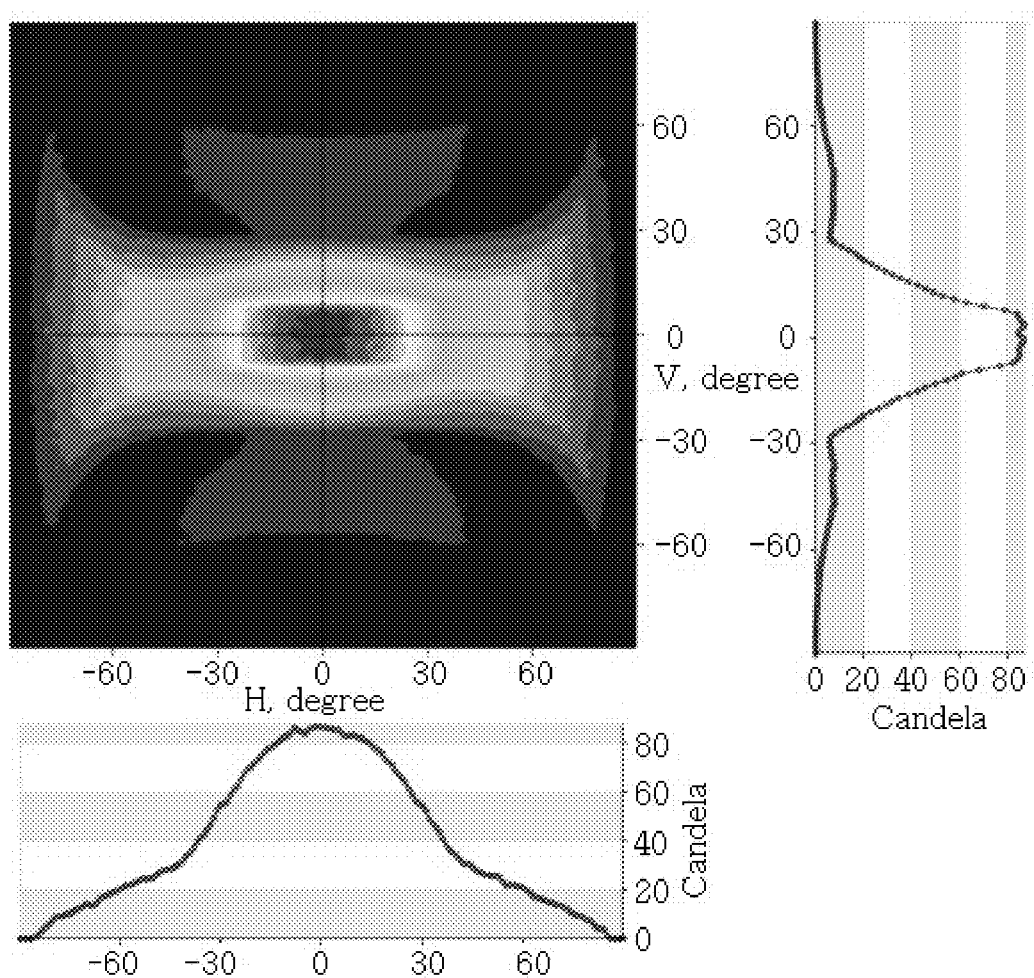
FIG. 7B is a view showing the optical profile with respect to the viewing angle of the second lens of the viewing angle switchable display device according to the embodiment of the present disclosure.

FIG. 7A is a view showing the optical profile with respect to the viewing angle of the first lens of the viewing angle switchable display device according to the embodiment of the present disclosure, and FIG. 7B is a view showing the optical profile with respect to the viewing angle of the second lens of the viewing angle switchable display device according to the embodiment of the present disclosure. FIGS. 7A and 7B will be described with reference to FIG. 1 and FIGS. 6A and 6B.

In FIGS. 7A and 7B, it can be seen that the first emission area EA1 provided with the hemispherical first lens 232 can have a narrow viewing angle of 30 degrees or less in both vertical and horizontal directions (e.g., for providing a narrow viewing mode), while the second emission area EA2 provided with the semi-cylindrical second lens 234 can have a narrow viewing angle of 30 degrees or less in the vertical direction, that is, the up and down direction, and a wide viewing angle of 60 degrees or more in the horizontal direction, that is, the left and right direction (e.g., for providing a wide viewing mode).

Accordingly, a vertical narrow view mode and a horizontal narrow view mode can be implemented by driving the first emission area EA1, and a vertical narrow view mode and a horizontal wide view mode can be implemented by driving the second emission area EA2.

That is, in the viewing angle switchable display device according to the embodiment of the present disclosure, the wide view mode and the narrow view mode can be selectively implemented in the horizontal direction by the first and second lens 232 and 234 while the display device always has the narrow viewing angle in the vertical direction.

The wide view mode and the narrow view mode in the horizontal direction will be described with reference to FIG. 8.

Figure 8:
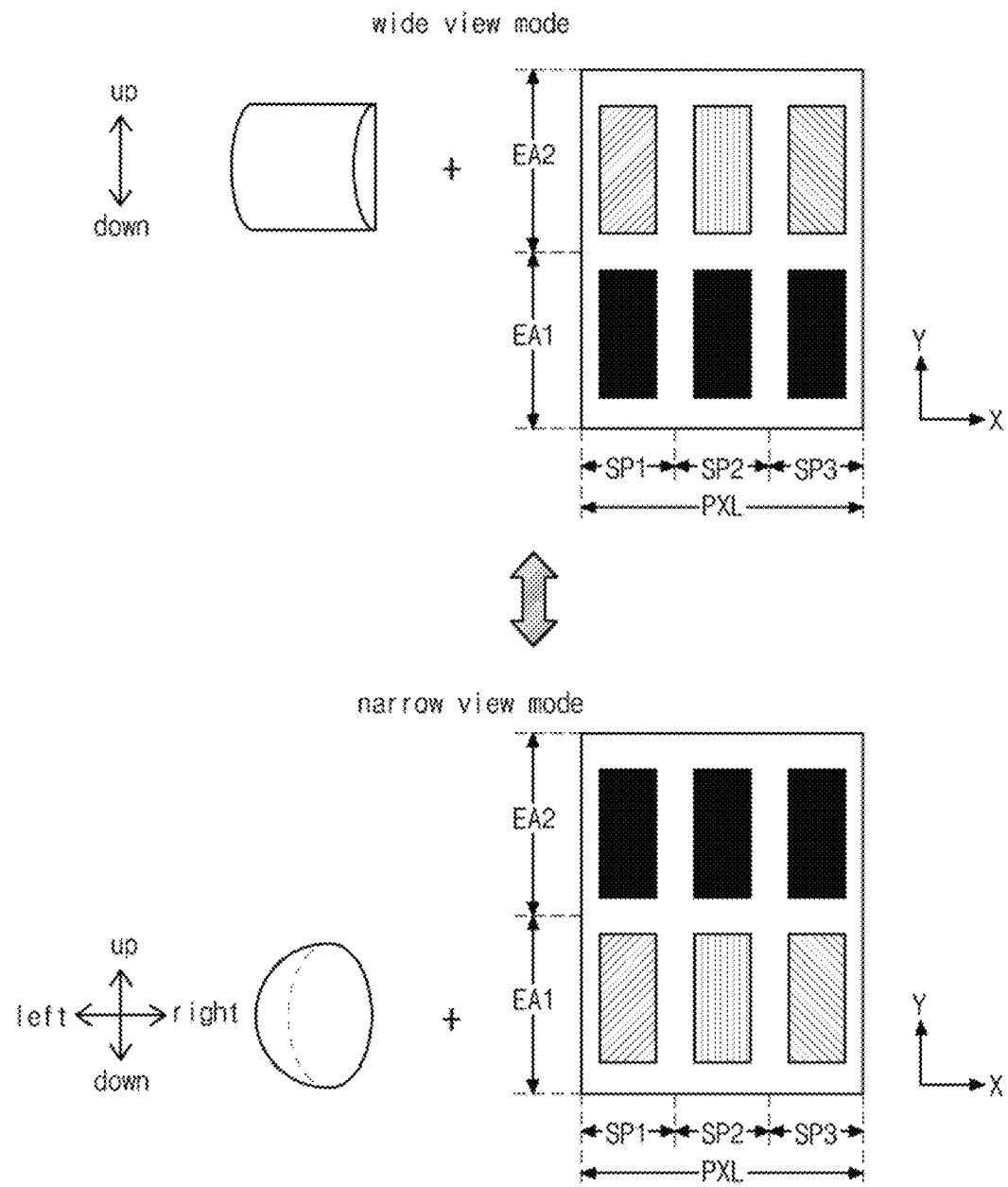
FIG. 8 is a view schematically illustrating operations of the wide view mode and the narrow view mode of the viewing angle switchable display device according to the embodiment of the present disclosure.

FIG. 8 is a view schematically illustrating operations of the wide view mode and the narrow view mode of the viewing angle switchable display device according to the embodiment of the present disclosure, and will be described with reference to FIG. 1.

In FIG. 8, one pixel PXL of the viewing angle switchable display device according to the embodiment of the present disclosure can include the first, second, and third sub-pixels SP1, SP2, and SP3, and each of the first, second, and third sub-pixels SP1, SP2, and SP3 can have the first and second emission areas EA1 and EA2. The first lens 232 of a hemispherical shape can be provided to correspond to the first emission areas EA1, and the second lens 234 of a semi-cylindrical shape can be provided to correspond to the second emission areas EA2.

When operating in the wide view mode, the first light-emitting diode De1 of the first emission area EA1 can be in an OFF state, and the second light-emitting diode De2 of the second emission area EA2 can be in an ON state. Light emitted from the second light-emitting diode De2 can be output with limiting the viewing angle by the second lens 234 in the Y direction, that is, in the vertical direction, and can be output without limiting the viewing angle in the X direction, that is, in the horizontal direction.

On the other hand, when operating in the narrow view mode, the first light-emitting diode De1 of the first emission area EA1 can be in an ON state, and the second light-emitting diode De2 of the second emission area EA2 can be in an OFF state. Light emitted from the first light-emitting diode De1 can be output with limiting the viewing angle by the first lens 232 in the vertical direction and in the horizontal direction.

As described above, since the viewing angle switchable display device according to the embodiment of the present disclosure can always have the narrow viewing angle in the vertical direction, it is possible to prevent an image from being reflected by the windscreen or windshield of a vehicle and obstructing the driver's view when it is applied to the vehicle.

Further, in the wide view mode, an image having a wide viewing angle in the horizontal direction can be displayed, and in the narrow view mode, an image having a narrow viewing angle in the horizontal direction. In the wide view mode, both users of the driver's seat and the front passenger's seat can watch the image, and in the narrow view mode, one of the users of the driver's seat and the front passenger's seat can watch the image, so that the wide view mode and the narrow view mode can be selectively implemented in the horizontal direction.

Meanwhile, by applying the first and second lenses 232 and 234, the luminance compared to the same area can be increased due to the light-collecting effect, and thus, the viewing angle switchable display device according to the embodiment of the present disclosure can lower the driving voltage. An increase in the luminance efficiency by the first and second lenses 232 and 234 will be described with reference to FIGS. 9A and 9B.

Figure 9A:
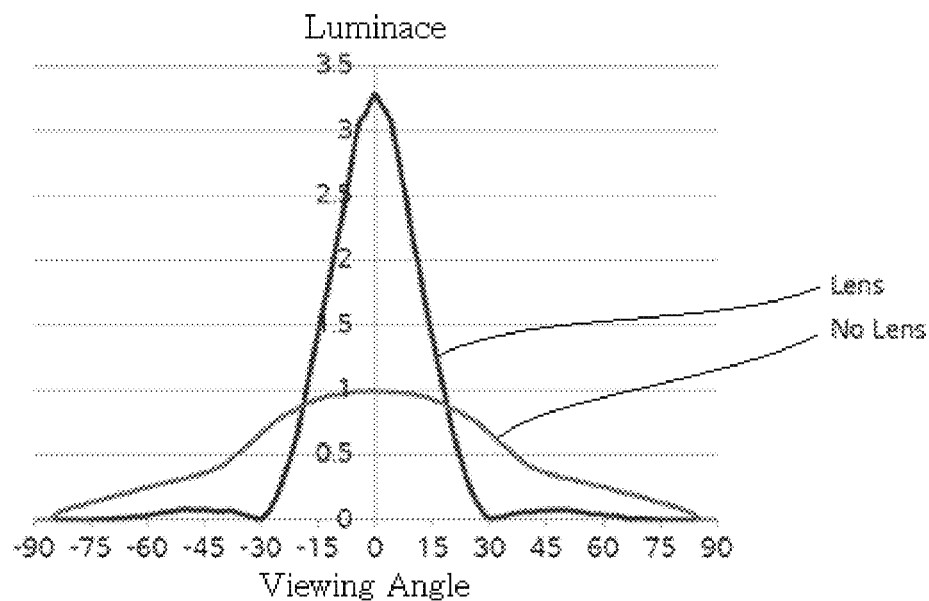
FIG. 9A is a graph showing the relative luminance with respect to the viewing angle of the first emission area of the viewing angle switchable display device according to the embodiment of the present disclosure.
Figure 9B:
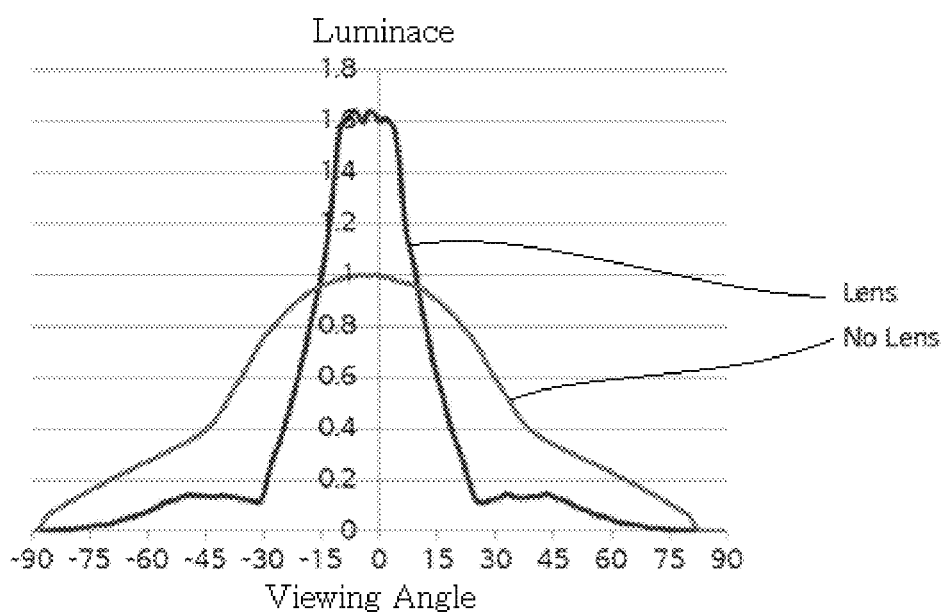
FIG. 9B is a graph showing the relative luminance with respect to the viewing angle of the second emission area of the viewing angle switchable display device according to the embodiment of the present disclosure.

FIG. 9A is a graph showing the relative luminance with respect to the viewing angle of the first emission area of the viewing angle switchable display device according to the embodiment of the present disclosure, FIG. 9B is a graph showing the relative luminance with respect to the viewing angle of the second emission area of the viewing angle switchable display device according to the embodiment of the present disclosure, and FIGS. 9A and 9B will be described with reference to FIG. 1 together.

In FIGS. 9A and 9B, the first emission area EA1 provided with the first lens 232 and the second emission area EA2 provided with the second lens 234 have higher luminance than an emission area without a lens and having the same size as the first and second emission areas EA1 and EA2.

As shown in FIG. 9A, it can be seen that the luminance efficiency of the first emission area EA1 is increased by about 327%.

In addition, as shown in FIG. 9B, it can be seen that the luminance efficiency of the second emission area EA2 is increased by about 165%.

Accordingly, since the first and second emission areas EA1 and EA2 can be driven by lowering the driving voltage, the power consumption can be reduced. In this situation, the luminance and heat generation can be decreased, so that the lifetimes of the first and second light-emitting diodes De1 and De2 can be extended.

As mentioned above, in the viewing angle switchable display device according to the embodiment of the present disclosure, the light-blocking patterns can be realized as conducting lines which can be used as touch electrodes, which will be described in detail with reference to FIG. 10.

Figure 10:
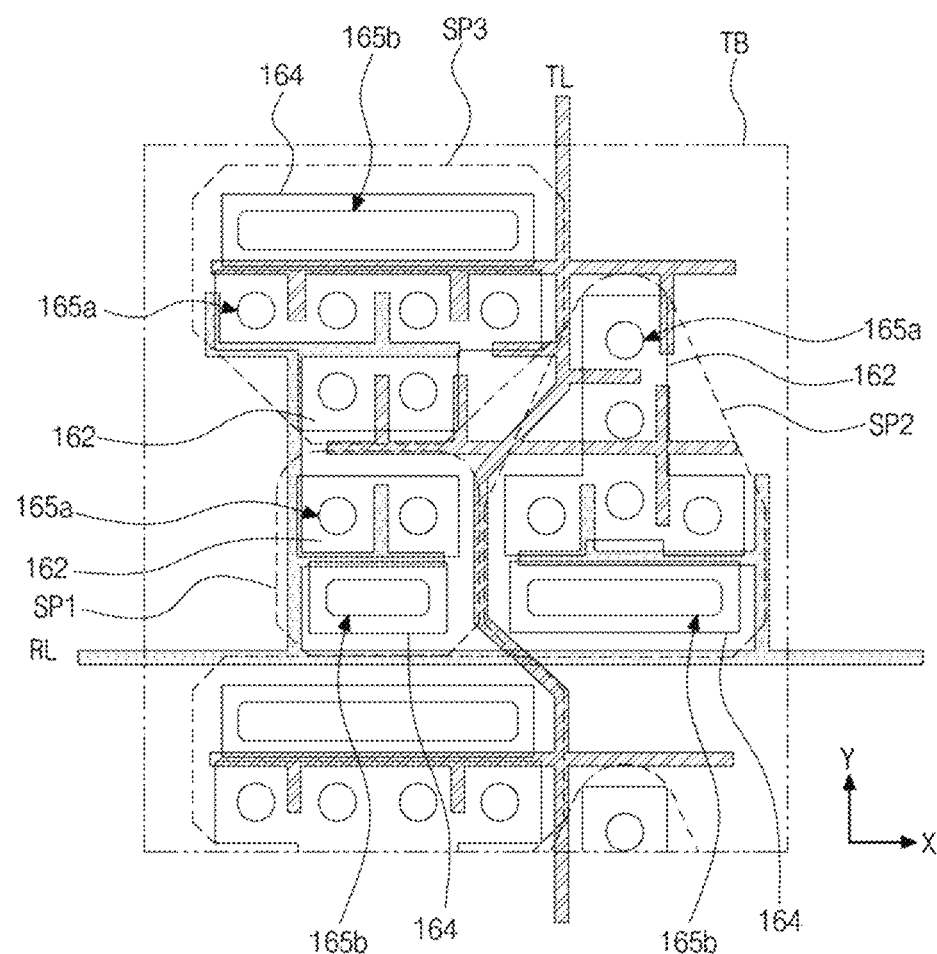
FIG. 10 is a plan view schematically illustrating the structure of light-blocking patterns of the viewing angle switchable display device according to the embodiment of the present disclosure.

FIG. 10 is a plan view schematically illustrating the structure of light-blocking patterns of the viewing angle switchable display device according to the embodiment of the present disclosure, and will be described with reference to FIG. 1 together.

In FIG. 10, the light-blocking pattern 210 of the viewing angle switchable display device according to the embodiment of the present disclosure can be touch electrodes including a plurality of transmitter electrodes TL and a plurality of receiver electrodes RL.

At this time, in one touch block TB, the plurality of transmitter electrodes TL and the plurality of receiver electrodes RL can be formed to correspond to a portion between adjacent first openings 165a, a portion between adjacent second openings 165b, and a portion between adjacent first and second openings 165a and 165b. Accordingly, the plurality of transmitter electrodes TL and the plurality of receiver electrodes RL can be formed to correspond to a space between adjacent first lenses 232, a space between adjacent second lenses 234, and a space between adjacent first and second lenses 232 and 234.

In this situation, the transmitter electrode TL can extend in the Y direction and can be connected to the transmitter electrode TL of another touch block TB adjacent thereto, and the receiver electrode RL can extend in the X direction and can be connected to the receiver electrode RL of another touch block TB adjacent thereto.

As described above, the viewing angle switchable display device according to the embodiment of the present disclosure can use the touch electrodes TL and RL as the light-blocking patterns 210.

The sub-pixel and operation of the viewing angle switchable display device according to the embodiment of the present disclosure will be described with reference to FIGS. 11 to 13.

Figure 11:
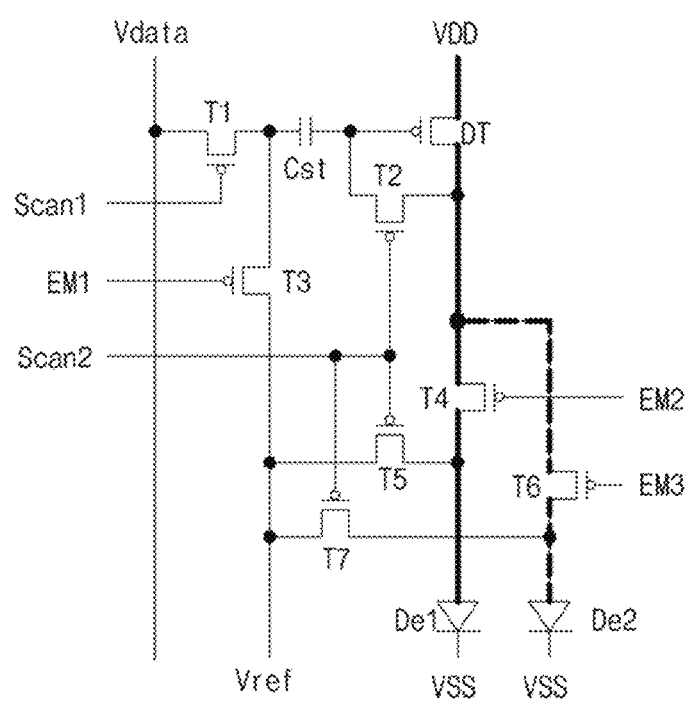
FIG. 11 is a circuit diagram showing a sub-pixel of a viewing angle switchable display device according to an embodiment of the present disclosure.
Figure 12:
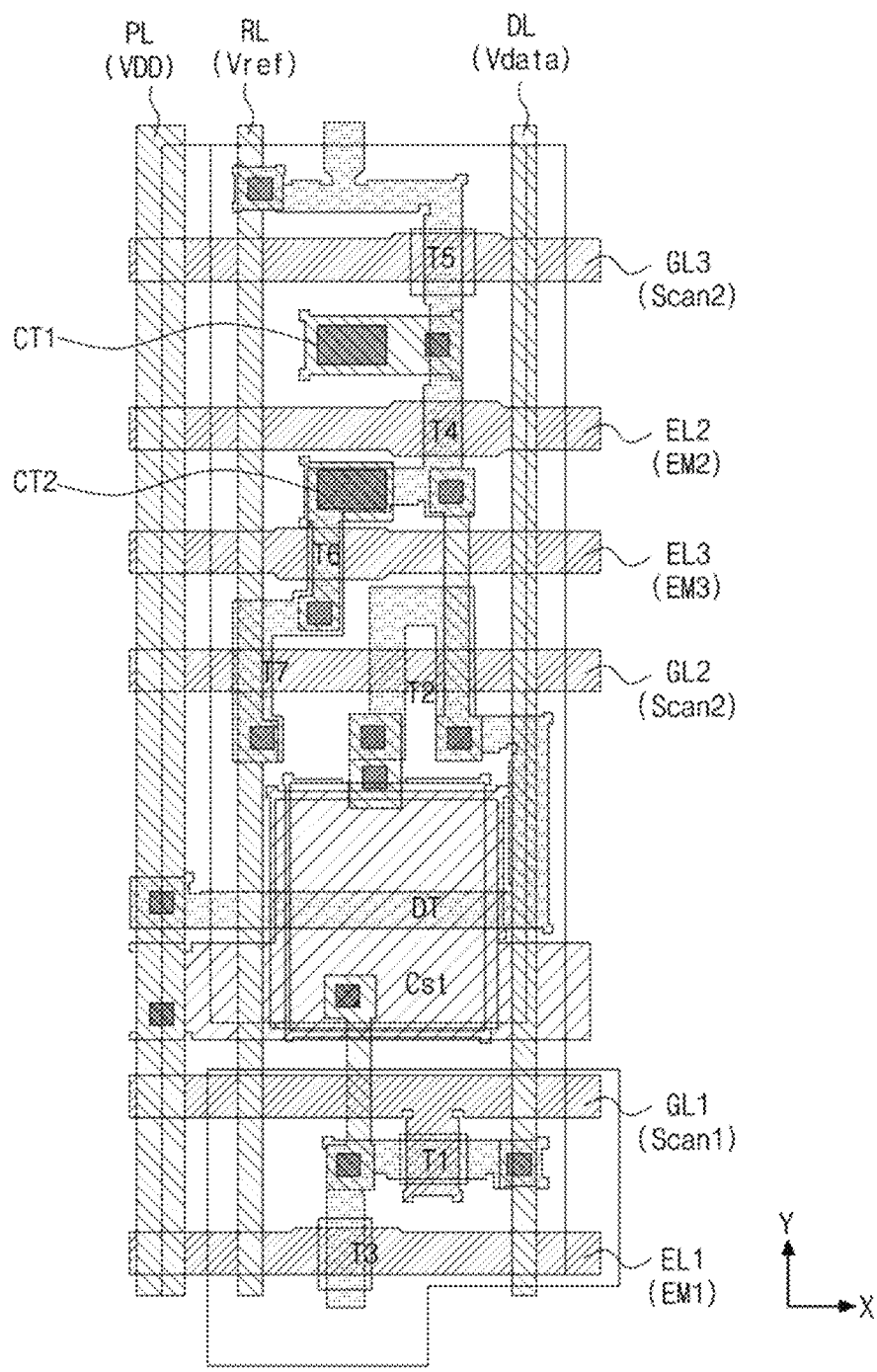
FIG. 12 is a plan view schematically illustrating the sub-pixel of the viewing angle switchable display device according to an embodiment of the present disclosure.

FIG. 11 is a circuit diagram showing a sub-pixel of a viewing angle switchable display device according to a first embodiment of the present disclosure, and FIG. 12 is a plan view schematically illustrating the sub-pixel of the viewing angle switchable display device according to the first embodiment of the present disclosure.

As shown in FIG. 11 and FIG. 12, in the viewing angle switchable display device according to a first embodiment of the present disclosure, first, second, and third gate lines GL1, GL2, and GL3 and first, second, and third emission lines EL1, EL2, and EL3 can extend in the X direction, and a data line DL, a reference line RL, and a power line PL can extend in the Y direction. The data line DL, the reference line RL, and the power line PL can cross the first, second, and third gate lines GL1, GL2, and GL3 and the first, second, and third emission lines EL1, EL2, and EL3 to thereby define the sub-pixel.

The first gate line GL1 can transmit a first gate signal Scan1, and the second and third gate lines GL2 and GL3 can transmit a second gate signal Scan2. The first, second, and third emission lines EL1, EL2, and EL3 can transmit first, second, and third emission signals EM1, EM2, and EM3, the data line DL can transmit a data signal Vdata, the reference line RL can transmit a reference signal Vref, and the power line PL can transmit a high potential voltage VDD.

The sub-pixel of the viewing angle switchable display device according to the first embodiment of the present disclosure can include a driving transistor DT, first, second, third, fourth, fifth, sixth and seventh transistors T1, T2, T3, T4, T5, T6 and T7, a storage capacitor Cst, and first and second light-emitting diodes De1 and De2.

For example, the driving transistor DT and the first, second, third, fourth, fifth, sixth and seventh transistors T1, T2, T3, T4, T5, T6 and T7 can be P-type transistors.

The driving transistor DT can be switched according to a voltage of a first electrode of the storage capacitor Cst and can be connected to the high potential voltage VDD. The first transistor T1 can be switched according to the first gate signal Scan1 and can be connected to the data signal Vdata. The second transistor T2 can be switched according to the second gate signal Scan2 and can be connected to the driving transistor DT. The third transistor T3 can be switched according to the first emission signal EM1 and can be connected to the reference signal Vref. The fourth transistor T4 can be switched according to the second emission signal EM2 and can be connected to the driving transistor DT. The fifth transistor T5 can be switched according to the second gate signal Scan2 and can be connected to the reference signal Vref and the fourth transistor T4. The sixth transistor T6 can be switched according to the third emission signal EM3 and can be connected to the driving transistor DT. The seventh transistor T7 can be switched according to the second gate signal Scan2 and can be connected to the reference signal Vref and the sixth transistor T6.

The storage capacitor Cst can store the data signal Vdata and the threshold voltage Vth. The first electrode of the storage capacitor Cst can be connected to the driving transistor DT and the second transistor T2, and a second electrode of the storage capacitor Cst can be connected to the first transistor T1 and the third transistor T3.

The first light-emitting diode De1 can be connected between the fourth and fifth transistors T4 and T5, and a low potential voltage VSS to emit light with luminance proportional to a current of the driving transistor DT. The first light-emitting diode De1 can be disposed to correspond to the plurality of hemispherical lenses and can implement the narrow view mode of the horizontal direction in the ON state and the wide view mode of the horizontal direction in the OFF state.

The second light-emitting diode De2 can be connected between the sixth and seventh transistors T6 and T7, and the low potential voltage VSS to emit light with luminance proportional to the current of the driving transistor DT. The second light-emitting diode De2 can be disposed to correspond to the semi-cylindrical lens and can implement the wide view mode of the horizontal direction in the ON state and the narrow view mode of the horizontal direction in the OFF state.

The first light-emitting diode De1 can be connected to a first contact part CT1 between the fourth transistor T4 and the fifth transistor T5, and the second light-emitting diode De2 can be connected to a second contact part CT2 between the sixth transistor T6 and the seventh transistor T7.

Figure 13:
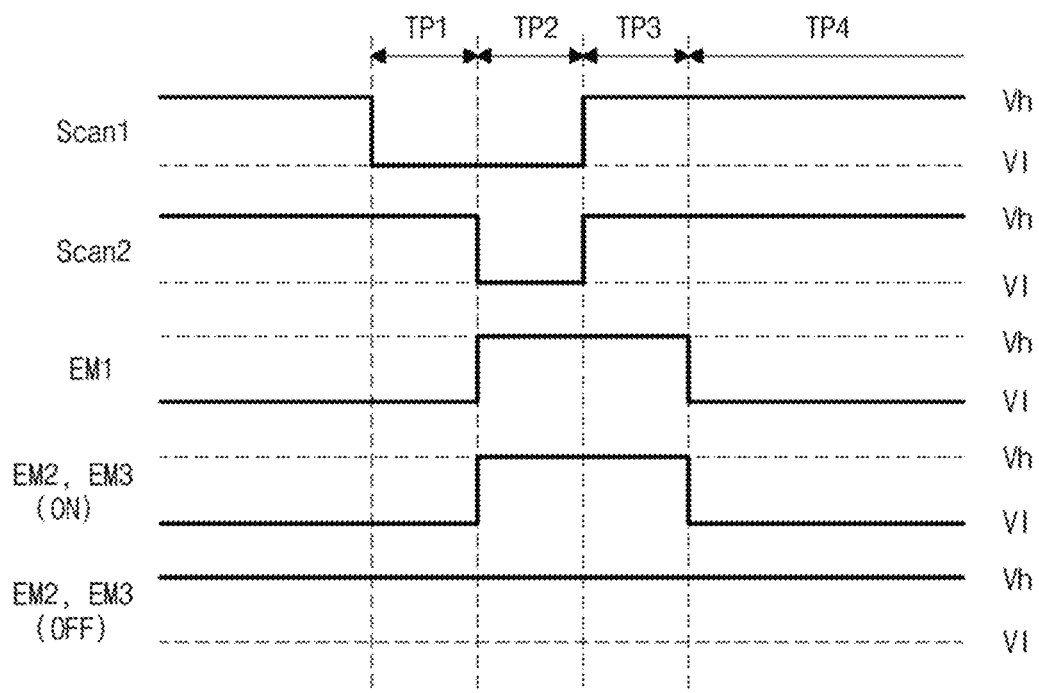
FIG. 13 is a waveform diagram showing the plurality of signals used in the sub-pixel of the viewing angle switchable display device according to an embodiment of the present disclosure.

FIG. 13 is a waveform diagram showing the plurality of signals used in the sub-pixel of the viewing angle switchable display device according to the first embodiment of the present disclosure, and will be described with reference to FIG. 11.

In FIG. 13, during a first time period TP1, which is an initialization period, the first gate signal Scan1 and the first emission signal EM1 can be a low level voltage V1, and the second gate signal Scan2 can be a high level voltage Vh. Accordingly, the first and third transistors T1 and T3 can be turned on, and the second, fifth, and seventh transistors T2, T5, and T7 can be turned off, thereby initializing the storage capacitor Cst.

During a second time period TP2, which is a sensing period, the first gate signal Scan1 and the second gate signal Scan2 can be a low level voltage V1, and the first emission signal EM1 can be a high level voltage Vh. Accordingly, the first, second, fifth, and seventh transistors T1, T2, T5, and T7 can be turned on, and the third transistor T3 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fifth, and seventh transistors T1, T2, T3, T5, and T7 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage V1. Accordingly, the first, second, fifth, and seventh transistors T1, T2, T5, and T7 can be turned off, and the third transistor T3 can be turned on. A current for which the threshold voltage Vth is compensated can flow through the driving transistor DT, and the fourth and sixth transistors T4 and T6 can be independently turned on/off according to the second and third emission signals EM2 and EM3, so that the first and second light-emitting diodes De1 and De2 can emit light with luminance corresponding to the current flowing through the driving transistor DT.

Here, when the second emission signal EM2 is the low level voltage V1 and the third emission signal EM3 is the high level voltage Vh, the fourth transistor T4 can be turned on, and the sixth transistor T6 can be turned off, so that only the first light-emitting diode De1 can emit light, thereby implementing the narrow view mode in the horizontal direction.

On the other hand, when the second emission signal EM2 is the high level voltage Vh and the third emission signal EM3 is the low level voltage V1, the fourth transistor T4 can be turned off, and the sixth transistor T6 can be turned on, so that only the second light-emitting diode De2 can emit light, thereby implementing the wide view mode in the horizontal direction.

Meanwhile, when the second and third emission signals EM2 and EM3 are the low level voltage V1, both the fourth and sixth transistors T4 and T6 can be turned on, so that both the first and second light-emitting diodes De1 and De2 can emit light, thereby implementing the wide view mode in the horizontal direction.

A pixel arrangement structure of the viewing angle switchable display device according to the first embodiment of the present disclosure including the sub-pixel will be described with reference to FIGS. 14 and 15.

Figure 14:
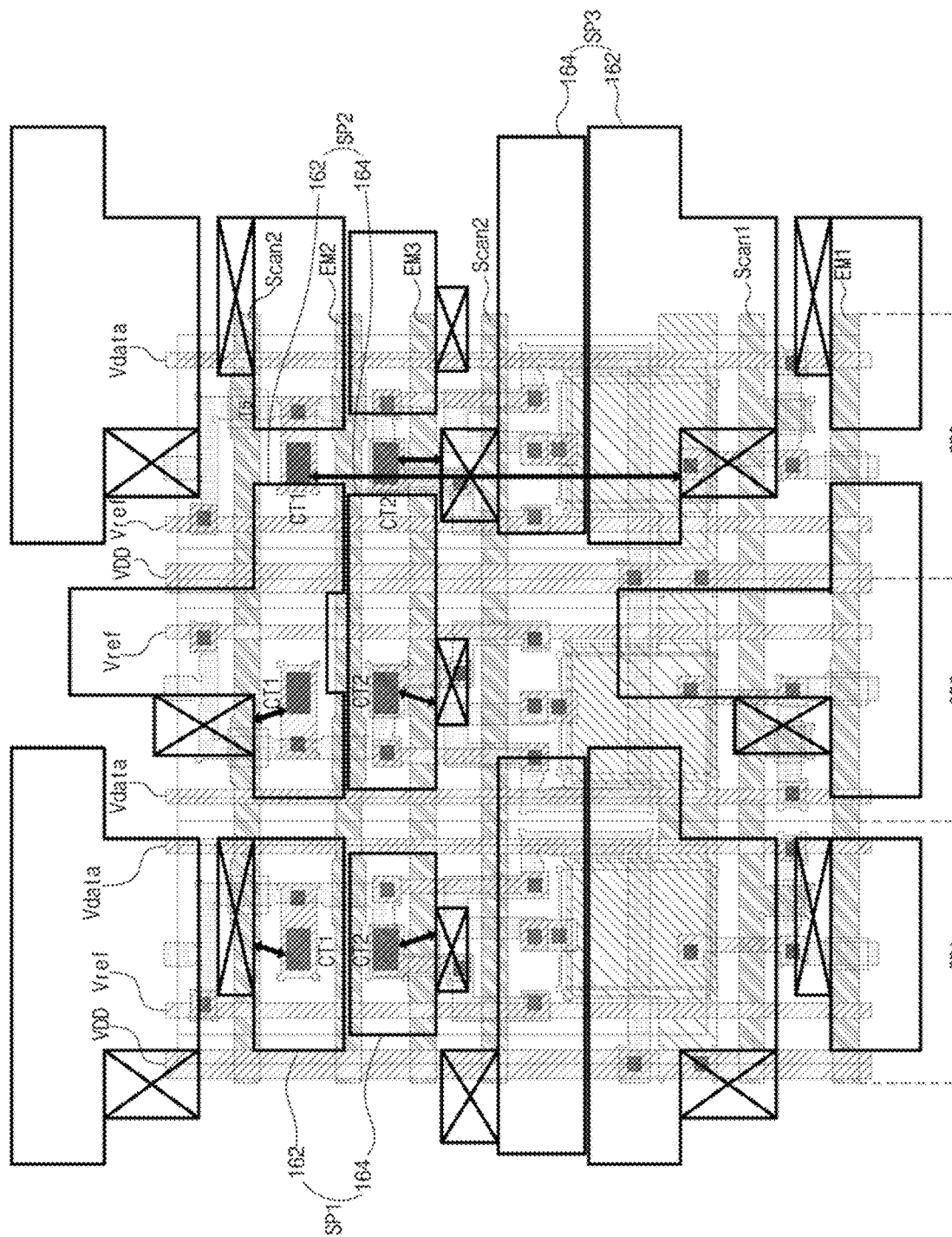
FIGS. 14 and 15 are views the pixel arrangement structure of the viewing angle switchable display device according to an embodiment of the present disclosure.
Figure 15:
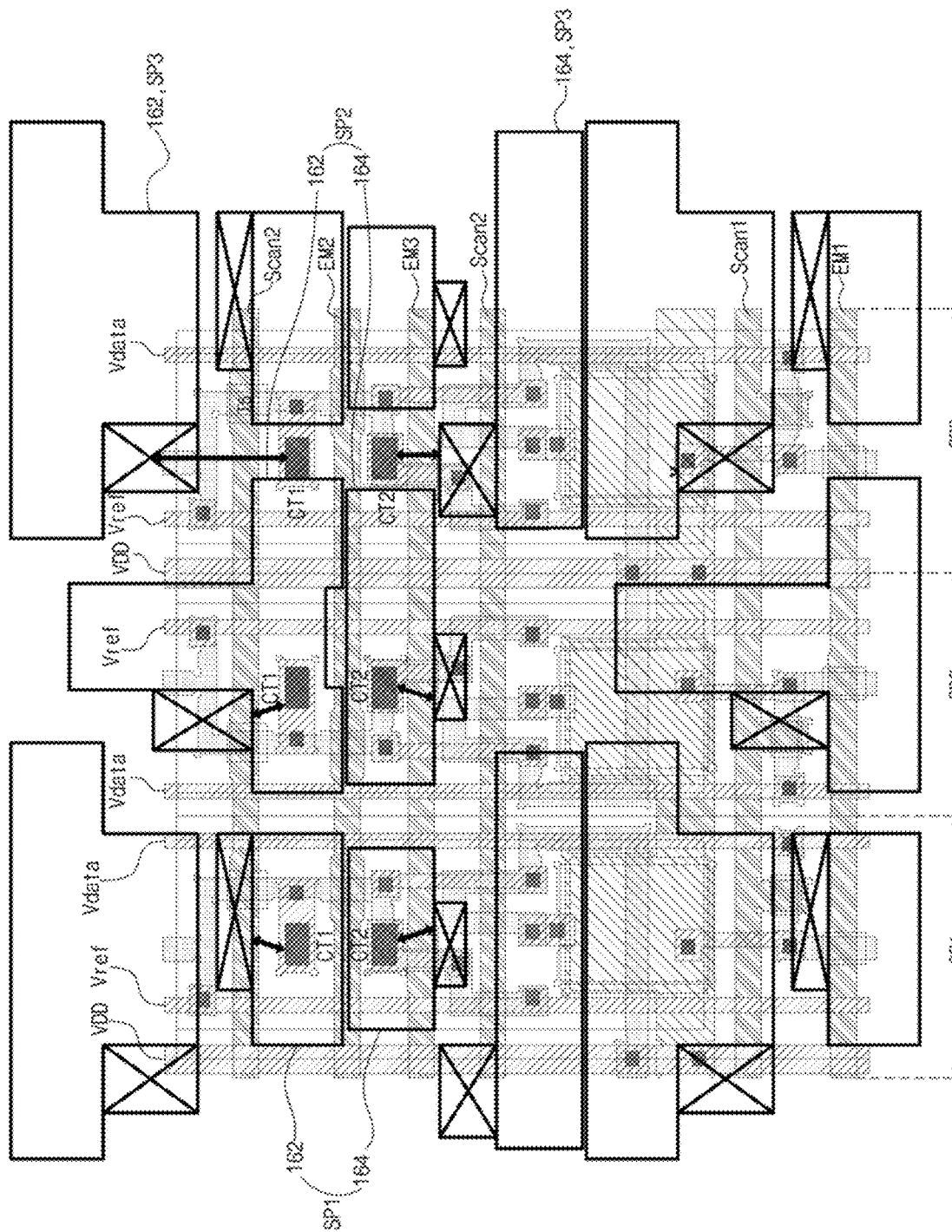

FIGS. 14 and 15 are views the pixel arrangement structure of the viewing angle switchable display device according to the first embodiment of the present disclosure, and show the connection relationship between the contact part and the light-emitting diode of each sub-pixel, that is, the connection relationship between the contact part and the emission area. Here, the emission area corresponds to the anode electrode of the light-emitting diode. For convenience, each line uses the transmitted signal as the reference sign.

In FIGS. 14 and 15, first, second, and third sub-pixels SP1, SP2, and SP3 can be sequentially disposed in the horizontal direction, and the second sub-pixel SP2 can be disposed between the first and third sub-pixels SP1 and SP3. The first sub-pixel SP1 and the third sub-pixel SP3 can have the same structure except for the first and second anode electrodes 162 and 164, and the second sub-pixel SP2 can have a symmetrical structure with the first sub-pixel SP1 and can also have a symmetrical structure with the third sub-pixel SP3 in the horizontal direction. That is, two sub-pixels having the same configuration as the first and second sub-pixels SP1 and SP2 symmetrical to each other can be repeatedly disposed.

The first contact part CT1 of the first sub-pixel SP1 can be connected to the first anode electrode 162 of the first sub-pixel SP1, and the second contact part CT2 of the first sub-pixel SP1 can be connected to the second anode electrode 164 of the first sub-pixel SP1. The first contact part CT1 of the second sub-pixel SP2 can be connected to the first anode electrode 162 of the second sub-pixel SP2, and the second contact part CT2 of the second sub-pixel SP2 can be connected to the second anode electrode 164 of the second sub-pixel SP2. The first contact part CT1 of the third sub-pixel SP3 can be connected to the first anode electrode 162 of the third sub-pixel SP3, and the second contact part CT2 of the third sub-pixel SP3 can be connected to the second anode electrode 164 of the third sub-pixel SP3.

At this time, as shown in FIG. 14, the first and second anode electrodes 162 and 164 of the third sub-pixel SP3 can be disposed between a second anode electrode 164 of a first sub-pixel SP1 of another pixel and a first anode electrode 162 of a first sub-pixel SP1 of one other pixel. The second contact part CT2 of the third sub-pixel SP3 and the second anode electrode 164 connected thereto can be disposed between the first contact part CT1 of the third sub-pixel SP3 and the first anode electrode 162 connected thereto.

Alternatively, as shown in FIG. 15, first and second anode electrodes 162 and 164 of a first sub-pixel SP1 of another pixel can be disposed between the first and second anode electrodes 162 and 164 of the third sub-pixel SP3, and the first and second contact parts CT1 and CT2 of the third sub-pixel SP3 can be disposed between the first anode electrode 162 and the second anode electrode 164 of the third sub-pixel SP3. In this situation, it is easier to design the pixel.

Figure 16:
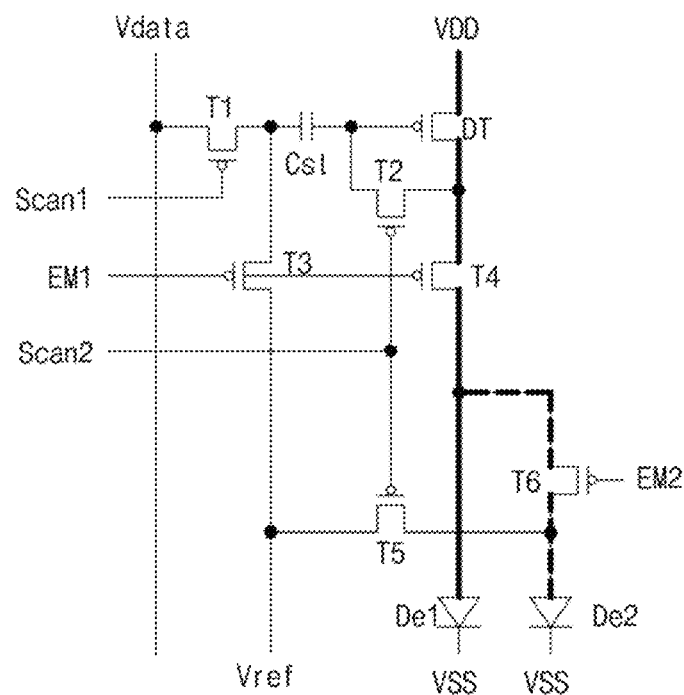
FIG. 16 is a circuit diagram showing a sub-pixel of a viewing angle switchable display device according to another embodiment of the present disclosure.

FIG. 16 is a circuit diagram showing a sub-pixel of a viewing angle switchable display device according to a second embodiment of the present disclosure.

In the sub-pixel of the viewing angle switchable display device according to the second embodiment of the present disclosure, the fifth transistor T5 of FIG. 11 is substantially omitted, and the position of the fourth transistor, the switching signals, and the connection of the sixth transistor are different from the sub-pixel of the first embodiment. For example, the pixel circuit in the second embodiment can have one less transistor than the pixel circuit in the first embodiment.

In FIG. 16, the sub-pixel of the viewing angle switchable display device according to the second embodiment of the present disclosure can include a driving transistor DT, first, second, third, fourth, fifth, and sixth transistors T1, T2, T3, T4, T5 and T6, a storage capacitor Cst, and first and second light-emitting diodes De1 and De2.

For example, the driving transistor DT and the first, second, third, fourth, fifth, and sixth transistors T1, T2, T3, T4, T5 and T6 can be P-type transistors.

The driving transistor DT can be switched according to a voltage of a first electrode of the storage capacitor Cst and can be connected to the high potential voltage VDD. The first transistor T1 can be switched according to the first gate signal Scan1 and can be connected to the data signal Vdata. The second transistor T2 can be switched according to the second gate signal Scan2 and can be connected to the driving transistor DT. The third transistor T3 can be switched according to the first emission signal EM1 and can be connected to the reference signal Vref. The fourth transistor T4 can be switched according to the first emission signal EM1 and can be connected to the driving transistor DT. The fifth transistor T5 can be switched according to the second gate signal Scan2 and can be connected to the reference signal Vref and the sixth transistor T6. The sixth transistor T6 can be switched according to the second emission signal EM2 and can be connected to the fourth transistor T4.

The storage capacitor Cst can store the data signal Vdata and the threshold voltage Vth. The first electrode of the storage capacitor Cst can be connected to the driving transistor DT and the second transistor T2, and the second electrode of the storage capacitor Cst can be connected to the first transistor T1 and the third transistor T3.

The first light-emitting diode De1 can be connected between the fourth transistor T4 and the low potential voltage VSS to emit light with luminance proportional to a current of the driving transistor DT. The first light-emitting diode De1 can be disposed to correspond to the plurality of hemispherical lenses and can always be in the ON state, thereby implementing the narrow view mode or the wide view mode of the horizontal direction.

The second light-emitting diode De2 can be connected between the fifth and sixth transistors T5 and T6 and the low potential voltage VSS to emit light with luminance proportional to the current of the driving transistor DT. The second light-emitting diode De2 can be disposed to correspond to the semi-cylindrical lens and can implement the wide view mode of the horizontal direction in the ON state and the narrow view mode of the horizontal direction in the OFF state.

Figure 17:
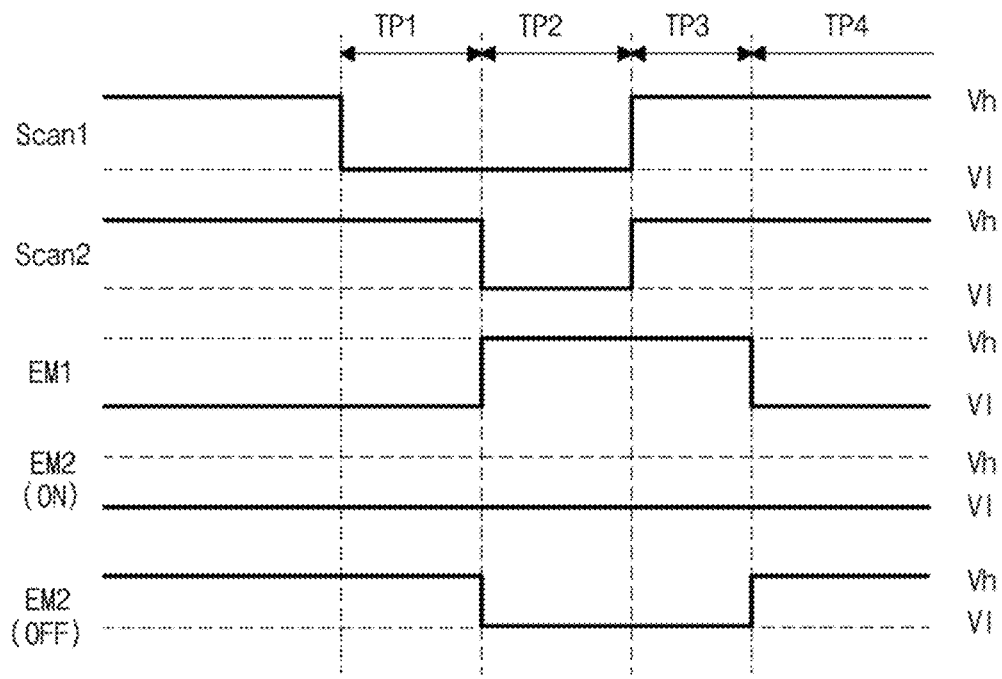
FIG. 17 is a waveform diagram showing the plurality of signals used in the sub-pixel of the viewing angle switchable display device according to an embodiment of the present disclosure.

FIG. 17 is a waveform diagram showing the plurality of signals used in the sub-pixel of the viewing angle switchable display device according to the second embodiment of the present disclosure, and will be described with reference to FIG. 16.

In FIG. 17, during a first time period TP1, which is an initialization period, the first gate signal Scan1 and the first emission signal EM1 can be a low level voltage V1, and the second gate signal Scan2 can be a high level voltage Vh. Accordingly, the first, third, and fourth transistors T1, T3, and T4 can be turned on, and the second and fifth transistors T2 and T5 can be turned off, thereby initializing the storage capacitor Cst.

During a second time period TP2, which is a sensing period, the first gate signal Scan1 and the second gate signal Scan2 can be a low level voltage V1, and the first emission signal EM1 can be a high level voltage Vh. Accordingly, the first, second, and fifth transistors T1, T2, and T5 can be turned on, and the third and fourth transistors T3 and T4 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fourth, and fifth transistors T1, T2, T3, T4 and T5 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage V1. Accordingly, the first, second, and fifth transistors T1, T2, and T5 can be turned off, and the third and fourth transistors T3 and T4 can be turned on. A current for which the threshold voltage Vth is compensated can flow through the driving transistor DT, and the first light-emitting diode De1 can emit light with luminance corresponding to the current flowing through the driving transistor DT. In addition, the sixth transistor T6 can be turned on/off according to the second emission signal EM2, so that the second light-emitting diode De2 can emit light with luminance corresponding to the current flowing through the driving transistor DT.

Here, when the second emission signal EM2 is the high level voltage Vh, the sixth transistor T6 can be turned off, so that only the first light-emitting diode De1 can emit light, thereby implementing the narrow view mode in the horizontal direction.

On the other hand, when the second emission signal EM2 is the low level voltage Vh, the sixth transistor T6 can be turned on, so that both the first and second light-emitting diodes De1 and De2 can emit light, thereby implementing the wide view mode in the horizontal direction.

Figure 18:
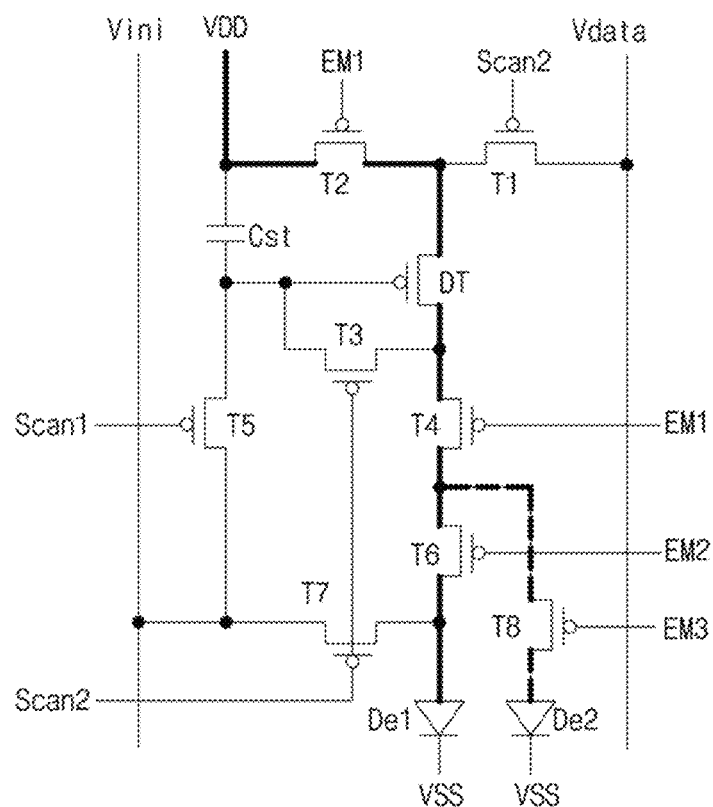
FIG. 18 is a circuit diagram showing a sub-pixel of a viewing angle switchable display device according to another embodiment of the present disclosure.

FIG. 18 is a circuit diagram showing a sub-pixel of a viewing angle switchable display device according to a third embodiment of the present disclosure.

In FIG. 18, the sub-pixel of the viewing angle switchable display device according to the third embodiment of the present disclosure can include a driving transistor DT, first, second, third, fourth, fifth, sixth, seventh, and eighth transistors T1, T2, T3, T4, T5, T6, T7 and T8, a storage capacitor Cst, and first and second light-emitting diodes De1 and De2.

For example, the driving transistor DT and the first, second, third, fourth, fifth, sixth, seventh, and eighth transistors T1, T2, T3, T4, T5, T6, T7 and T8 can be P-type transistors.

The driving transistor DT can be switched according to a voltage of a first electrode of the storage capacitor Cst and can be connected to the first and second transistors T1 and T2. The first transistor T1 can be switched according to the second gate signal Scan2 and can be connected to the data signal Vdata. The second transistor T2 can be switched according to the first emission signal EM1 and can be connected to the high potential voltage VDD. The third transistor T3 can be switched according to the second gate signal Scan2 and can be connected to the driving transistor DT. The fourth transistor T4 can be switched according to the first emission signal EM1 and can be connected to the driving transistor DT. The fifth transistor T5 can be switched according to the first gate signal Scan1 and can be connected to an initialization signal Vini. The sixth transistor T6 can be switched according to the second emission signal EM2 and can be connected to the fourth transistor T4. The seventh transistor T7 can be switched according to the second gate signal Scan2 and can be connected to the initialization signal Vini and the sixth transistor T6. The eighth transistor T8 can be switched according to the third emission signal EM3 and can be connected to the fourth transistor T4.

The storage capacitor Cst can store the high potential voltage VDD, the data signal Vdata, and the threshold voltage Vth. The first electrode of the storage capacitor Cst can be connected to the driving transistor DT, the third transistor T3, and the fifth transistor T5, and a second electrode of the storage capacitor Cst can be connected to the high potential voltage VDD and the second transistor T2.

The first light-emitting diode De1 can be connected between the sixth and seventh transistors T6 and T7 and the low potential voltage VSS to emit light with luminance proportional to a current of the driving transistor DT. The first light-emitting diode De1 can be disposed to correspond to the plurality of hemispherical lenses and can implement the narrow view mode of the horizontal direction in the ON state and the wide view mode of the horizontal direction in the OFF state.

The second light-emitting diode De2 can be connected between the eighth transistor T8 and the low potential voltage VSS to emit light with luminance proportional to the current of the driving transistor DT. The second light-emitting diode De2 can be disposed to correspond to the semi-cylindrical lens and can implement the wide view mode of the horizontal direction in the ON state and the narrow view mode of the horizontal direction in the OFF state.

Figure 19:
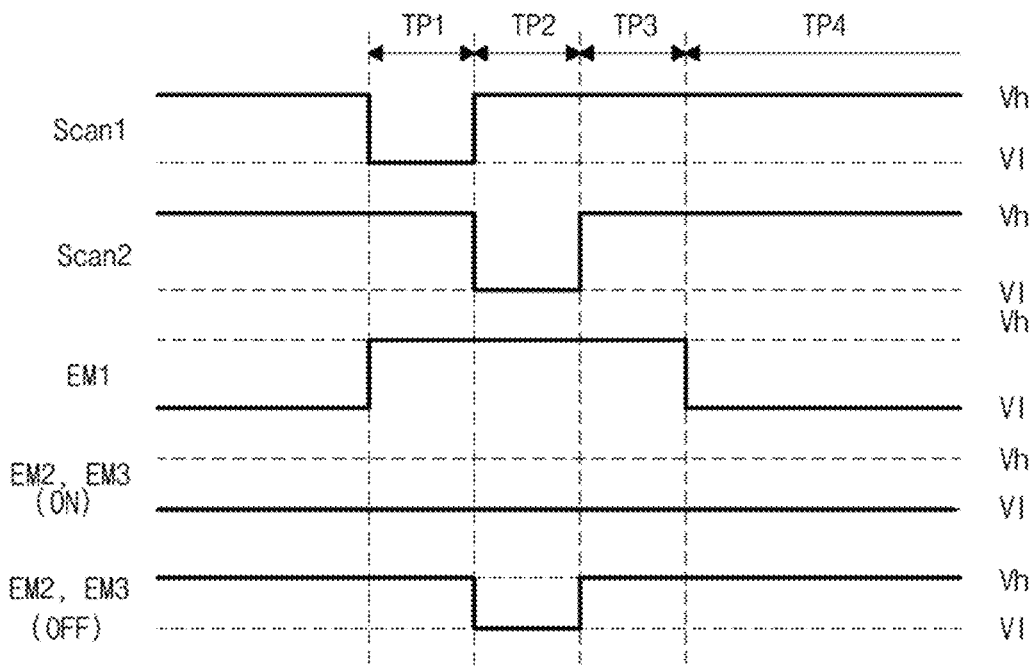
FIG. 19 is a waveform diagram showing the plurality of signals used in the sub-pixel of the viewing angle switchable display device according to an embodiment of the present disclosure.

FIG. 19 is a waveform diagram showing the plurality of signals used in the sub-pixel of the viewing angle switchable display device according to the third embodiment of the present disclosure, and will be described with reference to FIG. 18.

In FIG. 19, during a first time period TP1, which is an initialization period, the first gate signal Scan1 can be a low level voltage V1, and the second gate signal Scan2 and the first emission signal EM1 can be a high level voltage Vh. Accordingly, the fifth transistor T5 can be turned on, and the first, second, third, fourth, and seventh transistors T1, T2, T3, T4, and T7 can be turned off, thereby initializing the storage capacitor Cst.

During a second time period TP2, which is a sensing period, the second gate signal Scan2 can be a low level voltage V1, and the first gate signal Scan1 and the first emission signal EM1 can be a high level voltage Vh. Accordingly, the first, third, and seventh transistors T1, T3, and T7 can be turned on, and the second, fourth, and fifth transistors T2, T4, and T5 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fourth, fifth, and seventh transistors T1, T2, T3, T4, T5, and T7 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage V1. Accordingly, the first, third, fifth, and seventh transistors T1, T3, T5, and T7 can be turned off, and the second and fourth transistors T2 and T4 can be turned on. A current for which the threshold voltage Vth is compensated can flow through the driving transistor DT, and the sixth and eighth transistors T6 and T8 can be independently turned on/off according to the second and third emission signals EM2 and EM3, so that the first and second light-emitting diodes De1 and De2 can emit light with luminance corresponding to the current flowing through the driving transistor DT.

Here, when the second emission signal EM2 is the low level voltage V1 and the third emission signal EM3 is the high level voltage Vh, the sixth transistor T6 can be turned on, and the eighth transistor T8 can be turned off, so that only the first light-emitting diode De1 can emit light, thereby implementing the narrow view mode in the horizontal direction.

On the other hand, when the second emission signal EM2 is the high level voltage Vh and the third emission signal EM3 is the low level voltage V1, the sixth transistor T6 can be turned off, and the eighth transistor T8 can be turned on, so that only the second light-emitting diode De2 can emit light, thereby implementing the wide view mode in the horizontal direction.

Meanwhile, when the second and third emission signals EM2 and EM3 are the low level voltage V1, both the sixth and eighth transistors T6 and T8 can be turned on, so that both the first and second light-emitting diodes De1 and De2 can emit light, thereby implementing the wide view mode in the horizontal direction.

Figure 20:
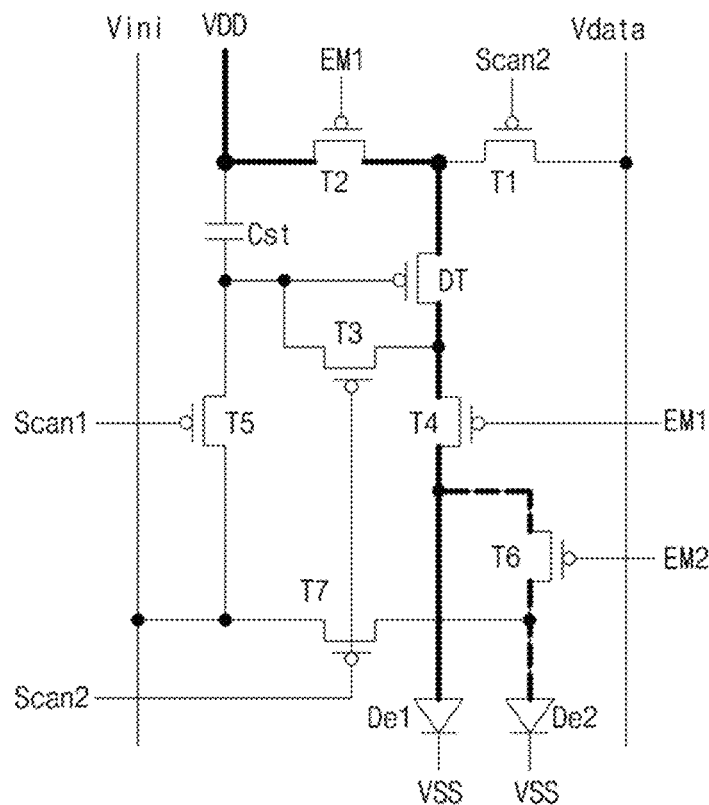
FIG. 20 is a circuit diagram showing a sub-pixel of a viewing angle switchable display device according to another embodiment of the present disclosure.

FIG. 20 is a circuit diagram showing a sub-pixel of a viewing angle switchable display device according to a fourth embodiment of the present disclosure.

In the sub-pixel of the viewing angle switchable display device according to the fourth embodiment of the present disclosure, the sixth transistor T6 of FIG. 18 is substantially omitted, and the switching signals and the connections of the fourth and seventh transistors are different from the sub-pixel of the third embodiment. For example, the pixel circuit in the fourth embodiment can have one less transistor than the pixel circuit in the third embodiment.

In FIG. 20, the sub-pixel of the viewing angle switchable display device according to the fourth embodiment of the present disclosure can include a driving transistor DT, first, second, third, fourth, fifth, sixth, and seventh transistors T1, T2, T3, T4, T5, T6 and T7, a storage capacitor Cst, and first and second light-emitting diodes De1 and De2.

For example, the driving transistor DT and the first, second, third, fourth, fifth, sixth, and seventh transistors T1, T2, T3, T4, T5, T6 and T7 can be P-type transistors.

The driving transistor DT can be switched according to a voltage of a first electrode of the storage capacitor Cst and can be connected to the first and second transistors T1 and T2. The first transistor T1 can be switched according to the first gate signal Scan1 and can be connected to the data signal Vdata. The second transistor T2 can be switched according to the first emission signal EM1 and can be connected to the high potential voltage VDD. The third transistor T3 can be switched according to the second gate signal Scan2 and can be connected to the driving transistor DT. The fourth transistor T4 can be switched according to the first emission signal EM1 and can be connected to the driving transistor DT. The fifth transistor T5 can be switched according to the first gate signal Scan1 and can be connected to an initialization signal Vini. The sixth transistor T6 can be switched according to the second emission signal EM2 and can be connected to the fourth transistor T4. The seventh transistor T7 can be switched according to the second gate signal Scan2 and can be connected to the initialization signal Vini and the sixth transistor T6.

The storage capacitor Cst can store the high potential voltage VDD, the data signal Vdata, and the threshold voltage Vth. The first electrode of the storage capacitor Cst can be connected to the driving transistor DT, the third transistor T3, and the fifth transistor T5, and a second electrode of the storage capacitor Cst can be connected to the high potential voltage VDD and the second transistor T2.

The first light-emitting diode De1 can be connected between the fourth transistor T4 and the low potential voltage VSS to emit light with luminance proportional to a current of the driving transistor DT. The first light-emitting diode De1 can be disposed to correspond to the plurality of hemispherical lenses and can always be in the ON state, thereby implementing the narrow view mode or the wide view mode of the horizontal direction.

The second light-emitting diode De2 can be connected between the sixth and seventh transistors T6 and T7 and the low potential voltage VSS to emit light with luminance proportional to the current of the driving transistor DT. The second light-emitting diode De2 can be disposed to correspond to the semi-cylindrical lens and can implement the wide view mode of the horizontal direction in the ON state and the narrow view mode of the horizontal direction in the OFF state.

Figure 21:
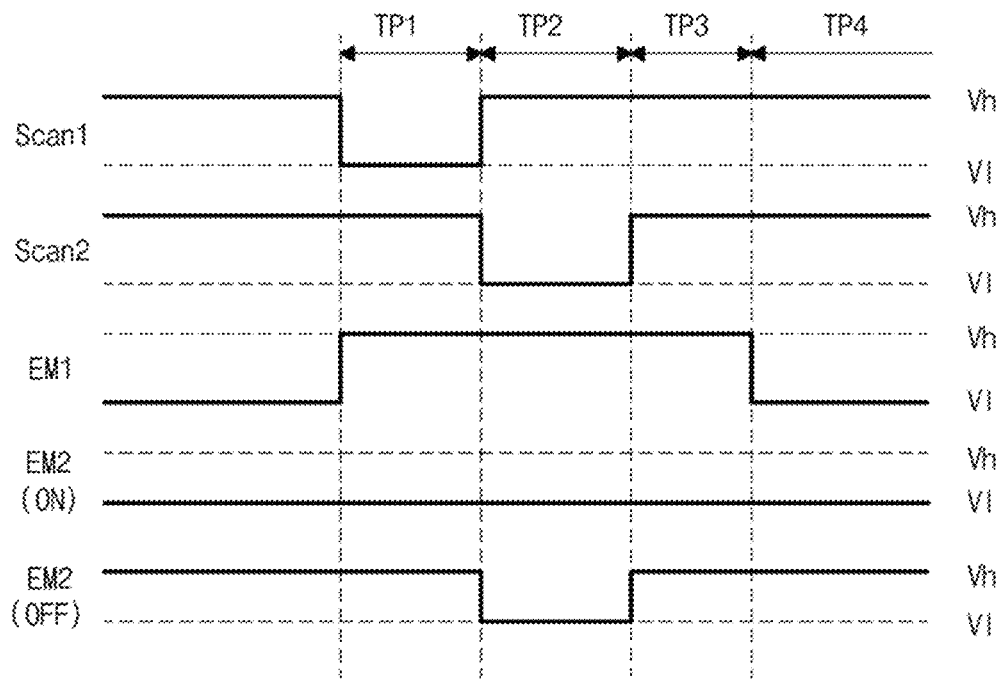
FIG. 21 is a waveform diagram showing the plurality of signals used in the sub-pixel of the viewing angle switchable display device according to an embodiment of the present disclosure.

FIG. 21 is a waveform diagram showing the plurality of signals used in the sub-pixel of the viewing angle switchable display device according to the fourth embodiment of the present disclosure, and will be described with reference to FIG. 20.

In FIG. 21, during a first time period TP1, which is an initialization period, the first gate signal Scan1 can be a low level voltage V1, and the second gate signal Scan2 and the first emission signal EM1 can be a high level voltage Vh. Accordingly, the fifth transistor T5 can be turned on, and the first, second, third, fourth, and seventh transistors T1, T2, T3, T4, and T7 can be turned off, thereby initializing the storage capacitor Cst.

During a second time period TP2, which is a sensing period, the second gate signal Scan2 can be a low level voltage V1, and the first gate signal Scan1 and the first emission signal EM1 can be a high level voltage Vh. Accordingly, the first, third, and seventh transistors T1, T3, and T7 can be turned on, and the second, fourth, and fifth transistors T2, T4, and T5 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fourth, fifth, and seventh transistors T1, T2, T3, T4, T5, and T7 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage V1. Accordingly, the first, third, fifth, and seventh transistors T1, T3, T5, and T7 can be turned off, and the second and fourth transistors T2 and T4 can be turned on. A current for which the threshold voltage Vth is compensated can flow through the driving transistor DT, and the first light-emitting diode De1 can emit light with luminance corresponding to the current flowing through the driving transistor DT. In addition, the sixth transistor T6 can be turned on/off according to the second emission signal EM2, so that the second light-emitting diode De2 can emit light with luminance corresponding to the current flowing through the driving transistor DT.

Here, when the second emission signal EM2 is the high level voltage Vh, the sixth transistor T6 can be turned off, so that only the first light-emitting diode De1 can emit light, thereby implementing the narrow view mode in the horizontal direction.

On the other hand, when the second emission signal EM2 is the low level voltage Vh, the sixth transistor T6 can be turned on, so that both the first and second light-emitting diodes De1 and De2 can emit light, thereby implementing the wide view mode in the horizontal direction.

Figure 22:
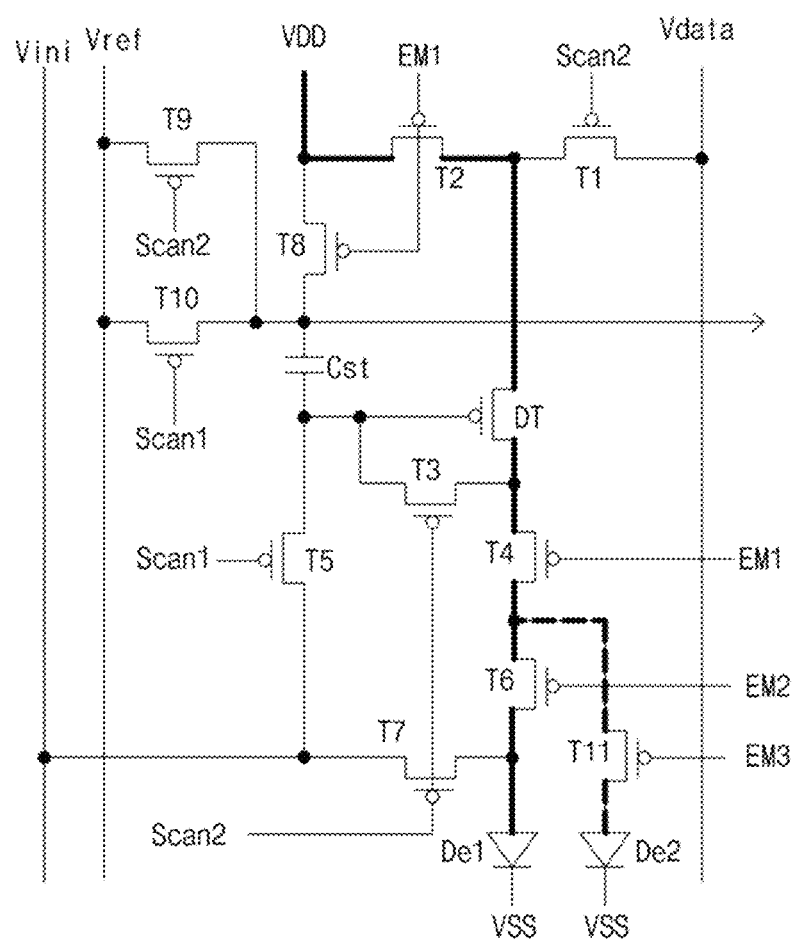
FIG. 22 is a circuit diagram showing a sub-pixel of a viewing angle switchable display device according to another embodiment of the present disclosure.

FIG. 22 is a circuit diagram showing a sub-pixel of a viewing angle switchable display device according to a fifth embodiment of the present disclosure.

In FIG. 22, the sub-pixel of the viewing angle switchable display device according to the fifth embodiment of the present disclosure can include a driving transistor DT, first, second, third, fourth, fifth, sixth, seventh, eighth, ninth, tenth and eleventh transistors T1, T2, T3, T4, T5, T6, T7, T8, T9, T10 and T11, a storage capacitor Cst, and first and second light-emitting diodes De1 and De2.

For example, the driving transistor DT and the first, second, third, fourth, fifth, sixth, seventh, eighth, ninth, tenth and eleventh transistors T1, T2, T3, T4, T5, T6, T7, T8, T9, T10 and T11 can be P-type transistors.

The driving transistor DT can be switched according to a voltage of a first electrode of the storage capacitor Cst and can be connected to the first and second transistors T1 and T2. The first transistor T1 can be switched according to the second gate signal Scan2 and can be connected to the data signal Vdata. The second transistor T2 can be switched according to the first emission signal EM1 and can be connected to the high potential voltage VDD. The third transistor T3 can be switched according to the second gate signal Scan2 and can be connected to the driving transistor DT. The fourth transistor T4 can be switched according to the first emission signal EM1 and can be connected to the driving transistor DT. The fifth transistor T5 can be switched according to the first gate signal Scan1 and can be connected to an initialization signal Vini. The sixth transistor T6 can be switched according to the second emission signal EM2 and can be connected to the fourth transistor T4. The seventh transistor T7 can be switched according to the second gate signal Scan2 and can be connected to the initialization signal Vini and the sixth transistor T6. The eighth transistor T8 can be switched according to the first emission signal EM1 and can be connected to the high potential voltage VDD. The ninth transistor T9 can be switched according to the second gate signal Scan2 and can be connected to the reference line Vref. The tenth transistor T10 can be switched according to the first gate signal Scan1 and can be connected to the reference line Vref. The eleventh transistor T11 can be switched according to the third emission signal EM3 and can be connected to the fourth transistor T4.

The storage capacitor Cst can store the high potential voltage VDD, the data signal Vdata, and the threshold voltage Vth. The first electrode of the storage capacitor Cst can be connected to the driving transistor DT, the third transistor T3, and the fifth transistor T5, and a second electrode of the storage capacitor Cst can be connected to the eighth, ninth and tenth transistors T8, T9 and T10.

The first light-emitting diode De1 can be connected between the sixth and seventh transistors T6 and T7 and the low potential voltage VSS to emit light with luminance proportional to a current of the driving transistor DT. The first light-emitting diode De1 can be disposed to correspond to the plurality of hemispherical lenses and can implement the narrow view mode of the horizontal direction in the ON state and the wide view mode of the horizontal direction in the OFF state.

The second light-emitting diode De2 can be connected between the eleventh transistor T11 and the low potential voltage VSS to emit light with luminance proportional to the current of the driving transistor DT. The second light-emitting diode De2 can be disposed to correspond to the semi-cylindrical lens and can implement the wide view mode of the horizontal direction in the ON state and the narrow view mode of the horizontal direction in the OFF state.

Figure 23:
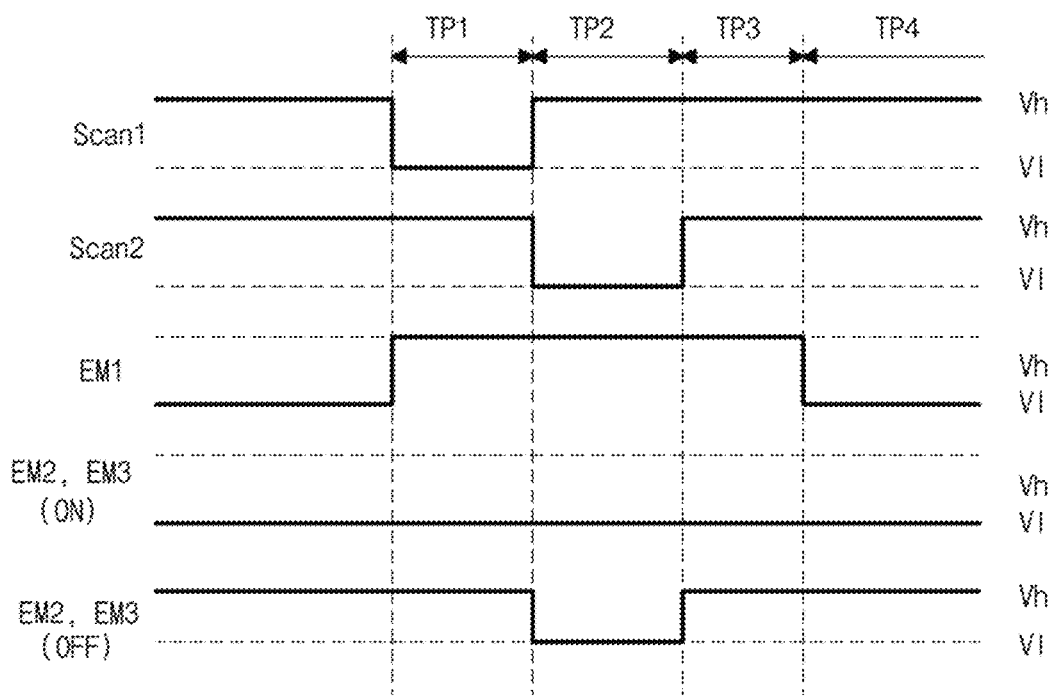
FIG. 23 is a waveform diagram showing the plurality of signals used in the sub-pixel of the viewing angle switchable display device according to an embodiment of the present disclosure.

FIG. 23 is a waveform diagram showing the plurality of signals used in the sub-pixel of the viewing angle switchable display device according to the fifth embodiment of the present disclosure, and will be described with reference to FIG. 22.

In FIG. 23, during a first time period TP1, which is an initialization period, the first gate signal Scan1 can be a low level voltage V1, and the second gate signal Scan2 and the first emission signal EM1 can be a high level voltage Vh. Accordingly, the fifth and tenth transistors T5 and T10 can be turned on, and the first, second, third, fourth, seventh, eighth and ninth transistors T1, T2, T3, T4, T7, T8 and T9 can be turned off, thereby initializing the storage capacitor Cst.

During a second time period TP2, which is a sensing period, the second gate signal Scan2 can be a low level voltage V1, and the first gate signal Scan1 and the first emission signal EM1 can be a high level voltage Vh. Accordingly, the first, third, seventh and ninth transistors T1, T3, T7 and T9 can be turned on, and the second, fourth, fifth, eighth and tenth transistors T2, T4, T5, T8 and T10 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fourth, fifth, seventh, eighth, ninth and tenth transistors T1, T2, T3, T4, T5, T7, T8, T9 and T10 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage V1. Accordingly, the first, third, fifth, seventh, ninth and tenth transistors T1, T3, T5, T7, T9 and T10 can be turned off, and the second, fourth and eighth transistors T2, T4 and T8 can be turned on. A current for which the threshold voltage Vth is compensated can flow through the driving transistor DT, and the sixth and eleventh transistors T6 and T11 can be independently turned on/off according to the second and third emission signals EM2 and EM3, so that the first and second light-emitting diodes De1 and De2 can emit light with luminance corresponding to the current flowing through the driving transistor DT.

Here, when the second emission signal EM2 is the low level voltage V1 and the third emission signal EM3 is the high level voltage Vh, the sixth transistor T6 can be turned on, and the eleventh transistor T11 can be turned off, so that only the first light-emitting diode De1 can emit light, thereby implementing the narrow view mode in the horizontal direction.

On the other hand, when the second emission signal EM2 is the high level voltage Vh and the third emission signal EM3 is the low level voltage V1, the sixth transistor T6 can be turned off, and the eleventh transistor T11 can be turned on, so that only the second light-emitting diode De2 can emit light, thereby implementing the wide view mode in the horizontal direction.

Meanwhile, when the second and third emission signals EM2 and EM3 are the low level voltage V1, both the sixth and eleventh transistors T6 and T11 can be turned on, so that both the first and second light-emitting diodes De1 and De2 can emit light, thereby implementing the wide view mode in the horizontal direction.

Figure 24:
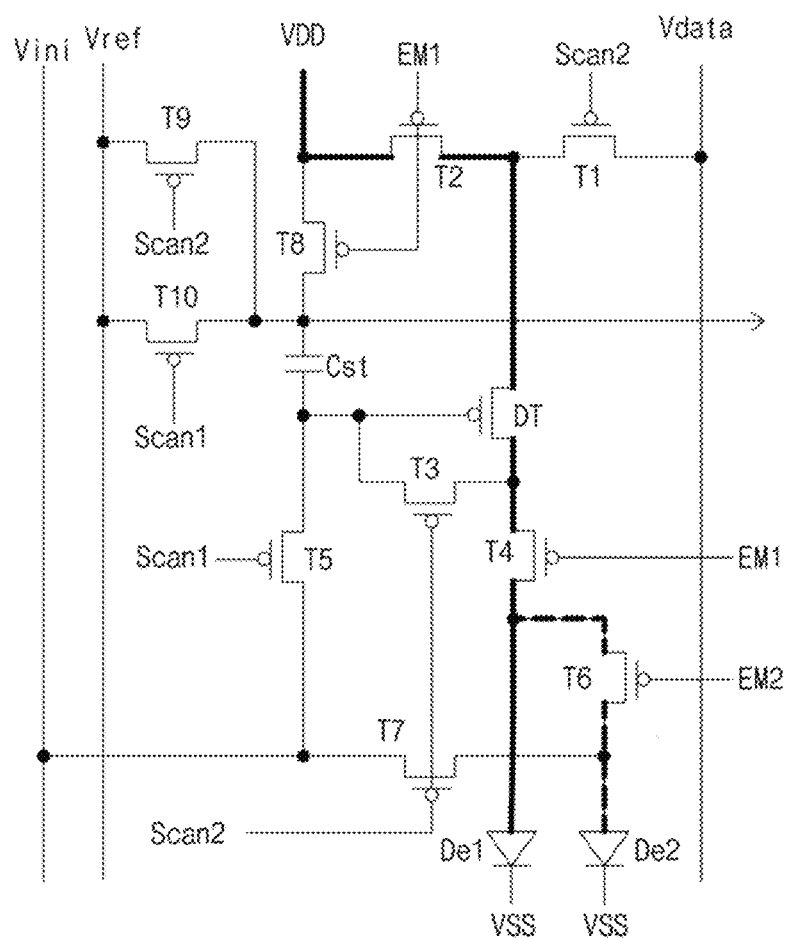
FIG. 24 is a circuit diagram showing a sub-pixel of a viewing angle switchable display device according to another embodiment of the present disclosure.

FIG. 24 is a circuit diagram showing a sub-pixel of a viewing angle switchable display device according to a sixth embodiment of the present disclosure.

In the sub-pixel of the viewing angle switchable display device according to the sixth embodiment of the present disclosure, the sixth transistor T6 of FIG. 22 is substantially omitted, and the connections of the fourth and seventh transistors are different from the sub-pixel of the fifth embodiment. For example, the pixel circuit in the sixth embodiment can have one less transistor than the pixel circuit in the fifth embodiment.

In FIG. 24, the sub-pixel of the viewing angle switchable display device according to the sixth embodiment of the present disclosure can include a driving transistor DT, first, second, third, fourth, fifth, sixth, seventh, eighth, ninth and tenth transistors T1, T2, T3, T4, T5, T6, T7, T8, T9 and T10, a storage capacitor Cst, and first and second light-emitting diodes De1 and De2.

For example, the driving transistor DT and the first, second, third, fourth, fifth, sixth, seventh, eighth, ninth and tenth transistors T1, T2, T3, T4, T5, T6, T7, T8, T9 and T10 can be P-type transistors.

The driving transistor DT can be switched according to a voltage of a first electrode of the storage capacitor Cst and can be connected to the first and second transistors T1 and T2. The first transistor T1 can be switched according to the second gate signal Scan2 and can be connected to the data signal Vdata. The second transistor T2 can be switched according to the first emission signal EM1 and can be connected to the high potential voltage VDD. The third transistor T3 can be switched according to the second gate signal Scan2 and can be connected to the driving transistor DT. The fourth transistor T4 can be switched according to the first emission signal EM1 and can be connected to the driving transistor DT. The fifth transistor T5 can be switched according to the first gate signal Scan1 and can be connected to an initialization signal Vini. The sixth transistor T6 can be switched according to the second emission signal EM2 and can be connected to the fourth transistor T4. The seventh transistor T7 can be switched according to the second gate signal Scan2 and can be connected to the initialization signal Vini and the sixth transistor T6. The eighth transistor T8 can be switched according to the first emission signal EM1 and can be connected to the high potential voltage VDD. The ninth transistor T9 can be switched according to the second gate signal Scan2 and can be connected to the reference line Vref. The tenth transistor T10 can be switched according to the first gate signal Scan1 and can be connected to the reference line Vref.

The storage capacitor Cst can store the high potential voltage VDD, the data signal Vdata, and the threshold voltage Vth. The first electrode of the storage capacitor Cst can be connected to the driving transistor DT, the third transistor T3, and the fifth transistor T5, and a second electrode of the storage capacitor Cst can be connected to the eighth, ninth, and tenth transistors T8, T9, and T10.

The first light-emitting diode De1 can be connected between the fourth transistor T4 and the low potential voltage VSS to emit light with luminance proportional to a current of the driving transistor DT. The first light-emitting diode De1 can be disposed to correspond to the plurality of hemispherical lenses and can always be in the ON state, thereby implementing the narrow view mode or the wide view mode of the horizontal direction.

The second light-emitting diode De2 can be connected between the sixth and seventh transistors T6 and T7 and the low potential voltage VSS to emit light with luminance proportional to the current of the driving transistor DT. The second light-emitting diode De2 can be disposed to correspond to the semi-cylindrical lens and can implement the wide view mode of the horizontal direction in the ON state and the narrow view mode of the horizontal direction in the OFF state.

Figure 25:
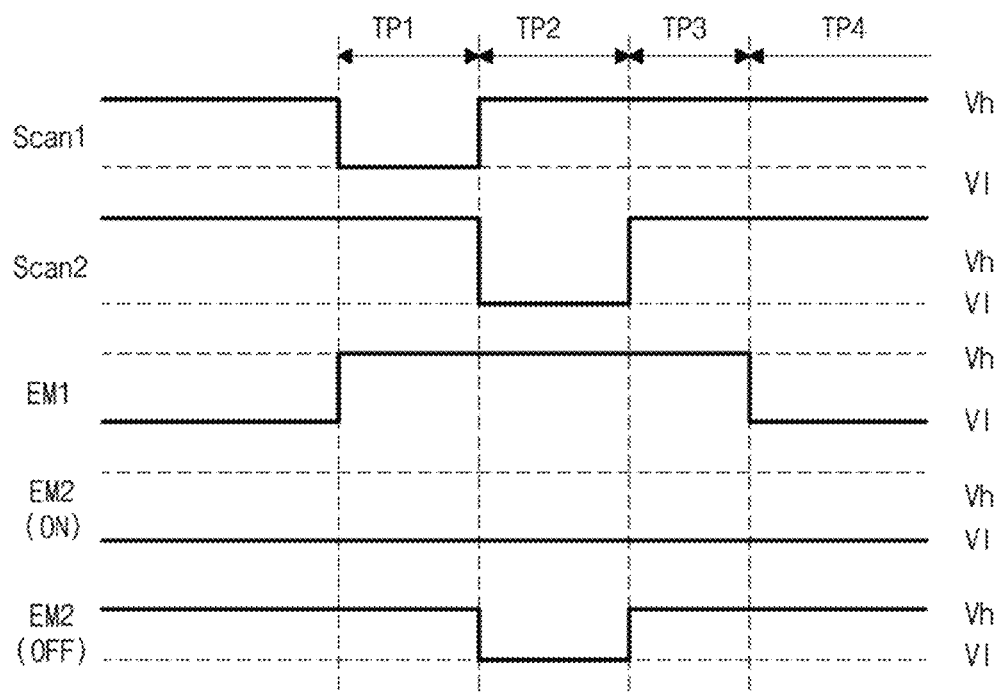
FIG. 25 is a waveform diagram showing the plurality of signals used in the sub-pixel of the viewing angle switchable display device according to an embodiment of the present disclosure.

FIG. 25 is a waveform diagram showing the plurality of signals used in the sub-pixel of the viewing angle switchable display device according to the sixth embodiment of the present disclosure, and will be described with reference to FIG. 24.

In FIG. 25, during a first time period TP1, which is an initialization period, the first gate signal Scan1 can be a low level voltage V1, and the second gate signal Scan2 and the first emission signal EM1 can be a high level voltage Vh. Accordingly, the fifth and tenth transistors T5 and T10 can be turned on, and the first, second, third, fourth, seventh, eighth and ninth transistors T1, T2, T3, T4, T7, T8 and T9 can be turned off, thereby initializing the storage capacitor Cst.

During a second time period TP2, which is a sensing period, the second gate signal Scan2 can be a low level voltage V1, and the first gate signal Scan1 and the first emission signal EM1 can be a high level voltage Vh. Accordingly, the first, third, seventh and ninth transistors T1, T3, T7 and T9 can be turned on, and the second, fourth, fifth, eighth and tenth transistors T2, T4, T5, T8 and T10 can be turned off, thereby storing the threshold voltage Vth in the storage capacitor Cst.

During a third time period TP3, which is a holding period, the first gate signal Scan1, the second gate signal Scan2, and the first emission signal EM1 can be a high level voltage Vh. Accordingly, the first, second, third, fourth, fifth, seventh, eighth, ninth and tenth transistors T1, T2, T3, T4, T5, T7, T8, T9 and T10 can be turned off, thereby maintaining the threshold voltage Vth stored in the storage capacitor Cst.

During a fourth time period TP4, which is an emission period, the first gate signal Scan1 and the second gate signal Scan2 can be a high level voltage Vh, and the first emission signal EM1 can be a low level voltage V1. Accordingly, the first, third, fifth, seventh, ninth and tenth transistors T1, T3, T5, T7, T9 and T10 can be turned off, and the second, fourth and eighth transistors T2, T4 and T8 can be turned on. A current for which the threshold voltage Vth is compensated can flow through the driving transistor DT, and the first light-emitting diode De1 can emit light with luminance corresponding to the current flowing through the driving transistor DT. In addition, the sixth transistor T6 can be turned on/off according to the second emission signal EM2, so that the second light-emitting diode De2 can emit light with luminance corresponding to the current flowing through the driving transistor DT.

Here, when the second emission signal EM2 is the high level voltage Vh, the sixth transistor T6 can be turned off, so that only the first light-emitting diode De1 can emit light, thereby implementing the narrow view mode in the horizontal direction.

On the other hand, when the second emission signal EM2 is the low level voltage Vh, the sixth transistor T6 can be turned on, so that both the first and second light-emitting diodes De1 and De2 can emit light, thereby implementing the wide view mode in the horizontal direction.

As described above, in the viewing angle switchable display device according to the embodiments of the present disclosure, it is possible to switch the viewing angle between the wide view mode and the narrow view mode in the horizontal direction through the divisional driving of an internal compensation circuit.

In the present disclosure, the first and second light-emitting diodes can be provided in each sub-pixel, and the hemispherical first lens and the semi-cylindrical second lens can be disposed to correspond to the first and second light-emitting diodes, respectively, so that the viewing angle can be selectively limited in the horizontal direction.

In addition, the power consumption can be reduced by the light-collecting efficiency of the first and second lenses, and the lifetimes of the light-emitting diodes can be extended.

Further, the wide view mode and the narrow view mode can be implemented by selectively driving the first and second light-emitting diodes through the divisional driving of the internal compensation circuit.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A viewing angle switchable display device, comprising:
a display panel including first, second, and third sub-pixels, each of the first, second, and third sub-pixels having a first emission area and a second emission area spaced apart from the first emission area; and
a lens layer disposed over the display panel and including a first type of lens corresponding to the first emission area and a second type of lens corresponding to the second emission area,
wherein the first type of lens has a different shape than the second type of lens, and
wherein a plurality of first lenses of the first type overlap with one first emission area in a same subpixel among at least one of the first, second, and third sub-pixels, and one second lens of the second type overlaps with the second emission areas in the first, second, and third sub-pixels.

2. The viewing angle switchable display device of claim 1, wherein the display panel is configured to:
display an image according to a wide view mode via the first emission area and the first type of lens, and
display the image according to a narrow view mode via the second emission area and the second type of lens.

3. The viewing angle switchable display device of claim 1, wherein the first and third sub-pixels are disposed adjacent to each other in a first direction, and the second sub-pixel is disposed adjacent to the first and third sub-pixels in a second direction perpendicular to the first direction.

4. The viewing angle switchable display device of claim 1, wherein the first emission areas of the first and third sub-pixels are disposed between the second emission area of the first sub-pixel and the second emission area of the third sub-pixel.

5. The viewing angle switchable display device of claim 4, wherein the first emission area of the second sub-pixel is disposed adjacent to the first emission areas of the first and third sub-pixels in the second direction, and
wherein the second emission area of the second sub-pixel is disposed adjacent to the second emission area of the first sub-pixel in the second direction.

6. The viewing angle switchable display device of claim 5, wherein the one second lens of the second type corresponds to the second emission area of the first sub-pixel and the second emission area of the second sub-pixel, and wherein another second lens of the second type corresponds to the second emission areas of adjacent third sub-pixels in the second direction.

7. The viewing angle switchable display device of claim 1, wherein the first type of lens is a hemispherical lens, and the second type of lens is a semi-cylindrical lens.

8. The viewing angle switchable display device of claim 1, wherein the second sub-pixel is larger than the first sub-pixel and smaller than the third sub-pixel.

9. The viewing angle switchable display device of claim 8, wherein a number of first lenses of the first type of lens in the second sub-pixel is greater than a number of first lenses of the first type of lens in the first sub-pixel and smaller than a number of first lenses of the first type of lens in third sub-pixel.

10. The viewing angle switchable display device of claim 1, wherein each of the first, second, and third sub-pixel includes:
a driving transistor connected to a high potential voltage;
a first transistor switched according to a first gate signal and connected to a data line;
a second transistor switched according to a second gate signal and connected to the driving transistor;
a third transistor switched according to a first emission signal and connected to a reference line;
a fourth transistor switched according to a second emission signal and connected to the driving transistor;
a fifth transistor switched according to the second gate signal and connected to the reference line and the fourth transistor;
a sixth transistor switched according to a third emission signal and connected to the driving transistor;
a seventh transistor switched according to the second gate signal and connected to the reference line and the sixth transistor;
a storage capacitor having a first electrode connected to the driving transistor and the second transistor, and a second electrode connected to the first and third transistors;
a first light-emitting diode connected between the fourth and fifth transistors and a low potential voltage, the first light-emitting diode being disposed in the first emission area; and
a second light-emitting diode connected between the sixth and seventh transistors and the low potential voltage, the second light-emitting diode being disposed in the second emission area.

11. The viewing angle switchable display device of claim 10, wherein each of the first, second, and third sub-pixels includes:
a first anode electrode of the first light-emitting diode connected to the fourth and fifth transistors through a first contact part; and
a second anode electrode of the second light-emitting diode connected to the sixth and seventh transistors through a second contact part, and
wherein the first contact part and the second contact part of the third sub-pixel are disposed between the first anode electrode and the second anode electrode of the third sub-pixel.

12. The viewing angle switchable display device of claim 1, wherein each of the first, second, and third sub-pixel includes:
a driving transistor connected to a high potential voltage;
a first transistor switched according to a first gate signal and connected to a data line;
a second transistor switched according to a second gate signal and connected to the driving transistor;
a third transistor switched according to a first emission signal and connected to a reference line;
a fourth transistor switched according to the first emission signal and connected to the driving transistor;
a fifth transistor switched according to the second gate signal and connected to the reference line;
a sixth transistor switched according to a second emission signal and connected to the fourth transistor and the fifth transistor;
a storage capacitor having a first electrode connected to the driving transistor and the second transistor, and a second electrode connected to the first and third transistors;
a first light-emitting diode connected between the fourth transistor and a low potential voltage, the first light-emitting diode being disposed in the first emission area; and
a second light-emitting diode connected between the fifth and sixth transistors and the low potential voltage, the second light-emitting diode being disposed in the second emission area.

13. The viewing angle switchable display device of claim 1, wherein each of the first, second, and third sub-pixel includes:
a first transistor switched according to a second gate signal and connected to a data line;
a second transistor switched according to a first emission signal and connected to a high potential voltage;
a driving transistor connected to the first and second transistors;
a third transistor switched according to the second gate signal and connected to the driving transistor;
a fourth transistor switched according to the first emission signal and connected to the driving transistor;
a fifth transistor switched according to a first gate signal and connected to an initialization signal line;
a sixth transistor switched according to a second emission signal and connected to the fourth transistor;
a seventh transistor switched according to the second gate signal and connected to the initialization signal line and the sixth transistor;
an eighth transistor switched according to a third emission signal and connected to the fourth transistor;
a storage capacitor having a first electrode connected to the driving transistor and the third and fifth transistors, and a second electrode connected to the high potential voltage and the second transistor;
a first light-emitting diode connected between the sixth and seventh transistors, and a low potential voltage, the first light-emitting diode being disposed in the first emission area; and
a second light-emitting diode connected between the eighth transistor and the low potential voltage, the second light-emitting diode being disposed in the second emission area.

14. The viewing angle switchable display device of claim 1, wherein each of the first, second, and third sub-pixel includes:
a first transistor switched according to a second gate signal and connected to a data line;
a second transistor switched according to a first emission signal and connected to a high potential voltage;

a driving transistor connected to the first and second transistors;
a third transistor switched according to the second gate signal and connected to the driving transistor;
a fourth transistor switched according to the first emission signal and connected to the driving transistor;
a fifth transistor switched according to a first gate signal and connected to an initialization signal line;
a sixth transistor switched according to a second emission signal and connected to the fourth transistor;
a seventh transistor switched according to the second gate signal and connected to the initialization signal line and the sixth transistor;
a storage capacitor having a first electrode connected to the driving transistor and the third and fifth transistors, and a second electrode connected to the high potential voltage and the second transistor;
a first light-emitting diode connected between the fourth transistor and a low potential voltage, the first light-emitting diode being disposed in the first emission area; and
a second light-emitting diode connected between the sixth and seventh transistors and the low potential voltage, the second light-emitting diode being disposed in the second emission area.

15. The viewing angle switchable display device of claim 1, wherein each of the first, second, and third sub-pixel includes:
a first transistor switched according to a second gate signal and connected to a data line;
a second transistor switched according to a first emission signal and connected to a high potential voltage;
a driving transistor connected to the first and second transistors;
a third transistor switched according to the second gate signal and connected to the driving transistor;
a fourth transistor switched according to the first emission signal and connected to the driving transistor;
a fifth transistor switched according to a first gate signal and connected to an initialization signal line;
a sixth transistor switched according to a second emission signal and connected to the fourth transistor;
a seventh transistor switched according to the second gate signal and connected to the initialization signal line and the sixth transistor;
an eighth transistor switched according to the first emission signal and connected to the high potential voltage;
a ninth transistor switched according to the second gate signal and connected to a reference line;
a tenth transistor switched according to the first gate signal and connected to the reference line;
an eleventh transistor switched according to a third emission signal and connected to the fourth transistor;
a storage capacitor having a first electrode connected to the driving transistor and the third and fifth transistors, and a second electrode connected to the eighth, ninth and tenth transistors;
a first light-emitting diode connected between the sixth and seventh transistors and a low potential voltage, the first light-emitting diode being disposed in the first emission area; and
a second light-emitting diode connected between the eleventh transistor and the low potential voltage, the second light-emitting diode being disposed in the second emission area.

16. The viewing angle switchable display device of claim 1, wherein each of the first, second, and third sub-pixel includes:
a first transistor switched according to a second gate signal and connected to a data line;
a second transistor switched according to a first emission signal and connected to a high potential voltage;
a driving transistor connected to the first and second transistors;
a third transistor switched according to the second gate signal and connected to the driving transistor;
a fourth transistor switched according to the first emission signal and connected to the driving transistor;
a fifth transistor switched according to a first gate signal and connected to an initialization signal line;
a sixth transistor switched according to a second emission signal and connected to the fourth transistor;
a seventh transistor switched according to the second gate signal and connected to the initialization signal line and the sixth transistor;
an eighth transistor switched according to the first emission signal and connected to the high potential voltage;
a ninth transistor switched according to the second gate signal and connected to a reference line;
a tenth transistor switched according to the first gate signal and connected to the reference line;
a storage capacitor having a first electrode connected to the driving transistor and the third and fifth transistors, and a second electrode connected to the eighth, ninth and tenth transistors;
a first light-emitting diode connected between the fourth transistor and a low potential voltage, the first light-emitting diode being disposed in the first emission area; and
a second light-emitting diode connected between the sixth and seventh transistors and the low potential voltage, the first light-emitting diode being disposed in the second emission area.

17. The viewing angle switchable display device of claim 1, further comprising light-blocking patterns disposed between the display panel and the lens layer,
wherein the light-blocking patterns correspond to a portion between adjacent first emission areas, a portion between adjacent second emission areas, and a portion between the first and second emission areas.

18. The viewing angle switchable display device of claim 17, wherein the light-blocking patterns are touch electrodes including a plurality of transmitter electrodes and a plurality of receiver electrodes crossing the plurality of the transmitter electrodes.

19. The viewing angle switchable display device of claim 17, further comprising a polarization layer disposed over the lens layer, the polarization layer including a linear polarization layer and a retardation layer.

20. A viewing angle switchable display device, comprising:
a display panel including first, second, and third sub-pixels, each of the first, second, and third sub-pixels having a first emission area and a second emission area; and
a lens layer over the display panel and including a first lens corresponding to the first emission area and a second lens corresponding to the second emission area,
wherein the first and third sub-pixels are disposed adjacent to each other in a first direction, and the second sub-pixel is disposed adjacent to the first and third sub-pixels in a second direction perpendicular to the first direction, and wherein a plurality of first lenses correspond to one first emission area, and one second lens corresponds to the second emission areas.

21. The viewing angle switchable display device of claim 20, wherein the first lens is a hemispherical lens, and the second lens is a semi-cylindrical lens.

22. The viewing angle switchable display device of claim 20, wherein the second sub-pixel is larger than the first sub-pixel and smaller than the third sub-pixel.

23. The viewing angle switchable display device of claim 22, wherein number of the first lens of the second sub-pixel is greater than number of the first lens of the first sub-pixel and smaller than number of the first lens of the third sub-pixel.

* * * * *